(12) United States Patent
Kasai

(10) Patent No.: US 10,913,183 B2
(45) Date of Patent: Feb. 9, 2021

(54) PROCESS FOR PRODUCING PACKAGE FOR MOUNTING A SEMICONDUCTOR ELEMENT AND MOLD RELEASE FILM

(71) Applicant: AGC Inc., Chiyoda-ku (JP)

(72) Inventor: Wataru Kasai, Chiyoda-ku (JP)

(73) Assignee: AGC Inc., Chiyoda-ku (JP)

( * ) Notice: Subject to any disclaimer, the term of this patent is extended or adjusted under 35 U.S.C. 154(b) by 114 days.

(21) Appl. No.: 15/256,957

(22) Filed: Sep. 6, 2016

(65) Prior Publication Data

US 2016/0368176 A1 Dec. 22, 2016

Related U.S. Application Data

(63) Continuation of application No. PCT/JP2015/056733, filed on Mar. 6, 2015.

(30) Foreign Application Priority Data

Mar. 7, 2014 (JP) .................................. 2014-045466

(51) Int. Cl.
*B32B 27/08* (2006.01)
*B29C 33/68* (2006.01)
(Continued)

(52) U.S. Cl.
CPC .............. *B29C 33/68* (2013.01); *B29C 45/02* (2013.01); *B29C 45/1418* (2013.01);
(Continued)

(58) Field of Classification Search
CPC ..... B29C 33/68; B29C 45/1418; B29C 45/02; B29C 45/14655; B29C 2045/025;
(Continued)

(56) References Cited

U.S. PATENT DOCUMENTS 6,579,960 B2 * 6/2003 Kamiya .................. B29C 33/68
526/250
2009/0053528 A1 * 2/2009 Okuya ..................... B29C 33/68
428/421

(Continued)

FOREIGN PATENT DOCUMENTS

CN 1960866 A * 5/2007
JP 2006-128354 5/2006
(Continued)

OTHER PUBLICATIONS

JP-2014014928-A Machine Translation (Year: 2014).*
(Continued)

*Primary Examiner* — Travis M Figg
(74) *Attorney, Agent, or Firm* — Oblon, McClelland, Maier & Neustadt, L.L.P.

(57) ABSTRACT

To provide a process for producing a package for mounting a semiconductor element by using a mold, said a package for mounting a semiconductor element comprising a substrate having a mounting surface for mounting a semiconductor element and a packaging body formed from a cured product of a curable resin and having a frame-shaped portion surrounding the mounting surface, and the package has a concave portion formed by the mounting surface and the packaging body, which allows it to prevent resin burrs without occurrence of dents or damage of a substrate and failure in releasing from a mold, and to provide a mold release film to be suitably used for the production process. A mold release film having a substantially constant thickness over the film, is disposed on the upper mold having a convex portion of which shape corresponds to the concave portion, the substrate is disposed on the lower portion, the upper mold and the lower mold are closed so as to be in close contact with the convex portion to the mounting portion of the substrate via the mold release film, a space formed (Continued)

between the upper mold and the lower mold is filled with a curable resin, followed by curing the curable resin, and the cured product is released together with the substrate, from the mold.

18 Claims, 5 Drawing Sheets

(51) Int. Cl.
*B32B 27/32* (2006.01)
*H01L 21/48* (2006.01)
*B32B 27/34* (2006.01)
*B29C 45/14* (2006.01)
*B32B 27/36* (2006.01)
*B32B 27/30* (2006.01)
*H01L 23/057* (2006.01)
*B32B 27/28* (2006.01)
*B32B 3/30* (2006.01)
*B32B 7/06* (2019.01)
*B32B 25/08* (2006.01)
*H01L 21/56* (2006.01)
*B29C 45/02* (2006.01)
*B32B 37/12* (2006.01)
*H01L 27/146* (2006.01)
*B29K 75/00* (2006.01)
*B29K 627/18* (2006.01)
*B29L 31/34* (2006.01)

(52) U.S. Cl.
CPC .......... *B29C 45/14655* (2013.01); *B32B 3/30* (2013.01); *B32B 7/06* (2013.01); *B32B 25/08* (2013.01); *B32B 27/08* (2013.01); *B32B 27/283* (2013.01); *B32B 27/302* (2013.01); *B32B 27/32* (2013.01); *B32B 27/322* (2013.01); *B32B 27/34* (2013.01); *B32B 27/36* (2013.01); *B32B 37/12* (2013.01); *H01L 21/4803* (2013.01); *H01L 21/565* (2013.01); *H01L 21/566* (2013.01); *H01L 23/057* (2013.01); *H01L 27/14618* (2013.01); *B29C 2045/025* (2013.01); *B29C 2045/14663* (2013.01); *B29K 2075/00* (2013.01); *B29K 2627/18* (2013.01); *B29L 2031/3481* (2013.01); *B32B 2250/24* (2013.01); *B32B 2307/54* (2013.01); *B32B 2327/18* (2013.01); *B32B 2375/00* (2013.01); *B32B 2439/00* (2013.01); *B32B 2457/00* (2013.01); *B32B 2457/14* (2013.01); *H01L 2924/0002* (2013.01)

(58) Field of Classification Search
CPC . B29C 2045/14663; B32B 7/06; B32B 25/08; B32B 27/08; B32B 27/283; B32B 27/302; B32B 27/32; B32B 27/34; B32B 27/322; B32B 27/36; B32B 3/30; B32B 37/12; B32B 2439/00; B32B 2457/00; B32B 2307/54; B32B 2250/24; B32B 2327/18; B32B 2375/00; B32B 2457/14; H01L 23/057; H01L 21/4803; H01L 27/14618; H01L 21/565; H01L 21/566; H01L 2924/0002; H01L 2924/00; B29K 2075/00; B29K 2627/18; B29L 2031/3481
USPC .................................................. 156/245, 242
See application file for complete search history.

(56) References Cited

U.S. PATENT DOCUMENTS

| | | | | |
|---|---|---|---|---|
| 2011/0133362 | A1* | 6/2011 | Sanada | B32B 27/32 264/272.17 |
| 2012/0148820 | A1* | 6/2012 | Okuya | B29C 33/68 428/220 |
| 2012/0156448 | A1* | 6/2012 | Sunaga | B29C 33/38 428/195.1 |
| 2013/0053493 | A1* | 2/2013 | Nakano | C08L 27/08 524/315 |
| 2014/0373914 | A1* | 12/2014 | Ninomiya | B32B 7/12 136/256 |

FOREIGN PATENT DOCUMENTS

| | | | |
|---|---|---|---|
| JP | 2007-81307 | | 3/2007 |
| JP | 2010-10227 | | 1/2010 |
| JP | 2010-208104 | | 9/2010 |
| JP | 2010208104 A | * | 9/2010 |
| JP | 4592386 | | 12/2010 |
| JP | 4653608 | | 3/2011 |
| JP | 4914406 | | 4/2012 |
| JP | 2014-14928 | | 1/2014 |
| JP | 2014014928 A | * | 1/2014 |

OTHER PUBLICATIONS

JP-2010208104-A Machine Translation (Year: 2010).*
CN-1960866-A Machine Translation (Year: 2007).*
English Translation of International Search Report dated May 26, 2015 in PCT/JP2015/056733, filed Mar. 6, 2015.

* cited by examiner

PROCESS FOR PRODUCING PACKAGE FOR MOUNTING A SEMICONDUCTOR ELEMENT AND MOLD RELEASE FILM

TECHNICAL FIELD

The present invention relates to a process for producing a package for mounting a semiconductor element and a mold release film to be used in the production process.

In recent years, as a hollow-structural semiconductor package (hereinafter referred to as a hollow package) for mounting a semiconductor element such as a solid-state imaging element or MEMS (micro-electro-mechanical systems), one adopting a resin as a package base (a packaging body) has been known for the purpose of reducing the cost. Further, as a package structure, DIP (dual inline package) is mainly adopted, but in recent years, SOP (small outline package) or QFP (quad flat package), which is a surface mounting type, has been used, and further a non-leaded package structure such as SON (small outline nonleaded package) or QFN (quad flat nonleaded package) has also been studied because a hollow package has been required to be small in size and thickness, and therefore surface mounting techniques of a hollow package is also being studied.

A known hollow package may, for example, be one obtained in such a manner that, on a substrate (such as a printed circuit board or a lead frame) having a mounting surface for mounting a semiconductor element, a packaging body having a frame-shaped portion surrounding the mounting surface is formed by using a curable resin, and an opening of the concave portion formed by the mounting surface and the frame-shaped portion is sealed with a lid.

As the process for producing a hollow package, a process has been proposed, wherein, as shown in FIG. 12, the convex portion 200 corresponding to a shape desired to be a hollow, formed on the cavity surface of the upper mold 202, is directly pressed on a portion to be exposed of the lead frame 206 made of a metal, placed on the lower mold 204, and in such a state, a space between the upper mold 202 and the lower mold 204 is filled with the resin 208, followed by molding (transfer molding). (e.g. Patent Document 1).

However, such a process may cause so-called "resin burrs" since the resin 208 filled is likely to penetrate into a space between the convex portion 200 and the lead frame 206 if the adhesion of the convex portion 200 and the lead frame 206 is poor. In particular, the thickness of the lead frame 206 tends to be uneven, and therefore the resin burrs may be formed in some areas on the lead frame 206 although other areas are free from the resin burrs. If a clamp pressure is increased in order to prevent the resin burrs, there are other problems such as a dent or damage on the lead frame 206.

As another process for producing a hollow package, a process has been proposed wherein an upper mold having a flat cavity surface is used instead of the upper mold 202 having the convex portion 200 on the cavity surface, and on the cavity surface of the mold release film, a mold release film integrally formed with a convex portion corresponding to the shape desired to be hollow is placed, followed by pressing the above convex portion on a part to be exposed of a lead frame, whereby transfer molding is carried out (Patent Document 2). According to this process, it is possible to mildly press the convex portion on the lead frame since the convex portion of the mold release film has a low elastic modulus as compared with a mold, and therefore it is possible to prevent resin burrs or damage.

However, such a process needs a step of integrally forming a convex portion on a mold release film, and such a step is cumbersome. In addition, the convex portion, which is made of a resin, is more likely to be uneven in thickness, and therefore resin burrs may be formed in some areas although other areas are free from them. If the clamp pressure is increased in order to prevent resin burrs, the tip of the convex portion 212 of the mold release film 210 may be clashed and protruded into a space to be filled with the resin 208, as shown in FIG. 13. If the transfer molding is carried out in such a state, the portion protruded may intrude into a packaging body, whereby releasing failure may occur to the packaging body. Moreover, the shape of the packaging body may also be deteriorated.

As another process for producing a hollow package, a process has been proposed wherein, as shown in FIG. 14, the bank 214 made of a resin is previously formed around a portion to be exposed of the lead frame 206, and the convex portion 200 of the upper mold 202 is pressed on the bank 214 to carry out transfer molding (Patent Document 3). In this method, the bank 214 prevents the resin 208 from leaking out to a portion to be exposed of the lead frame 206.

However, such a process requires an extra step of forming the bank 214 during processing the lead frame 206, the step is thus cumbersome, and in addition, if the bank 214 is uneven in height, resin burrs may be formed in some areas.

PRIOR ART DOCUMENTS

Patent Documents

Patent Document 1: JP-A-2006-128354
Patent Document 2: JP-A-2007-81307
Patent Document 3: JP-A-2010-10227

DISCLOSURE OF INVENTION

Technical Problem

The object of the present invention is to provide a process for producing a package for mounting a semiconductor element by using a mold, said a package for mounting a semiconductor element comprising a substrate having a mounting surface for mounting a semiconductor element and a packaging body formed from a cured product of a curable resin and having a frame-shaped portion surrounding the mounting surface, and the package has a concave formed by the mounting surface and the packaging body, according to which it is possible to prevent forming of dents or damage a substrate, occurrence of failure in releasing from a mold and forming of resin burrs, and the object of the present invention is to provide a mold release film to be suitably used for the production process.

Solution to Problem

The present invention provides a process for producing a package for mounting a semiconductor element and a mold release film, having the following constructions [1] to [10].
[1] A process for producing a package for mounting a semiconductor element by using a mold having an upper mold and a lower mold,
said package for mounting a semiconductor element, comprises a substrate having a mounting surface for mounting a semiconductor element and a packaging body formed from a cured product of a curable resin and having a frame-shaped portion surrounding the mounting surface, and the package has a concave portion formed by the mounting surface and the packaging body, and said process for producing a package for mounting a semiconductor element comprises:

a step of disposing a mold release film having a substantially constant thickness over the film, on the upper mold having a convex portion of which the shape corresponds to the concave portion, disposing the substrate on the lower mold, and closing the upper mold and the lower mold so as to be in close contact with the convex portion to the mounting portion of the substrate via the mold release film, a step of filling a space formed between the upper mold and the lower mold, with a curable resin, followed by curing the curable resin, and a step of releasing a cured product of the curable resin together with the substrate, from the mold.

[2] The process for producing a package for mounting a semiconductor element according to [1], wherein the mold release film has a first layer to be in contact with the curable resin at the time of curing the curable resin, and a second layer, the first layer has a thickness of from 3 to 25 μm and further has a tensile storage modulus at 180° C. being from 10 to 50 MPa, and the second layer has a product of the tensile storage modulus (MPa) at 180° C. and the thickness (μm) being from 2,000 to 13,000.

[3] The process for producing a package for mounting a semiconductor element according to [2], wherein the first layer has a thickness of from 5 to 12 μm, and the second layer has a product of the tensile storage modulus (MPa) at 180° C. and the thickness (μm) being from 3,000 to 8,000.

[4] The process for producing a package for mounting a semiconductor element according to Claim [2] or [4], wherein the mold release film further has a third layer to be in contact with the mold at the time of curing the curable resin, and the third layer has a thickness of from 3 to 25 μm, and further has a ratio of a tensile storage modulus at 25° C. to a tensile storage modulus at 25° C. of the first layer (i.e. the tensile storage modulus at 25° C. of the third layer/the tensile storage modulus at 25° C. of the first layer), being from 0.5 to 2.

[5] A mold release film to be used for the process for producing a package for mounting a semiconductor element as defined in [1], said mold release film comprises a first layer to be in contact with the curable resin at the time of curing the curable resin, and a second layer, wherein the first layer has a thickness of from 3 to 25 μm and further has a tensile storage modulus at 180° C. being from 10 to 50 MPa, and the second layer has a product of the tensile storage modulus (MPa) at 180° C. and the thickness (μm) being from 2,000 to 13,000.

[6] The mold release film according to [5], wherein the first layer has a thickness of from 5 to 12 μm, and the second layer has a product of the tensile storage modulus (MPa) at 180° C. and the thickness (μm) being from 3,000 to 8,000.

[7] The mold release film according to [5] or [6], which further has a third layer to be in contact with the mold at the time of curing the curable resin, wherein the third layer has a thickness of from 3 to 25 μm, and further has a ratio of a tensile storage modulus at 25° C. to a tensile storage modulus at 25° C. of the first layer (i.e. the tensile storage modulus at 25° C. of the third layer/the tensile storage modulus at 25° C. of the first layer), being from 0.5 to 2.

[8] The mold release film according to any one of [5] to [7], wherein a resin constituting the first layer is at least one member selected from the group consisting of a fluororesin, a polystyrene and a polyolefin having a melting point of at least 200° C.

[9] The mold release film according to any one of [5] to [8], wherein a resin constituting the second layer is at least one member selected from the group consisting of a non-stretched polyamide, a biaxially-stretched polyamide, a polybutylene terephthalate, a polyethylene terephthalate and a highly formable polyethylene terephthalate.

[10] The mold release film according to any one of [5] to [9], wherein a resin constituting the third layer is at least one member selected from the group consisting of a fluororesin, a fluororesin, an acrylic rubber, a thermosetting silicone, a polyester, a polyamide, a polystyrene, an ethylene/vinyl alcohol copolymer and a polyolefin having a melting point of at least 200° C.

Advantageous Effects of Invention

According to the present invention, in production of a package for mounting a semiconductor element by using a mold, said packaging for mounting a semiconductor element, comprises a substrate having a mounting surface for mounting a semiconductor element and a packaging body formed from a curable resin and having a frame-shaped portion surrounding the mounting surface, wherein the package has a concave portion formed by the mounting surface and the packaging body, even when the height of the mounting surface of the substrate (such as a lead frame) disposed on the lower mold of the mold is uneven and further even when the height of the convex portion of the upper mold is uneven, such an evenness can be compensated by a mold release film disposed on the convex portion of the upper mold, and it is possible to suppress resin burrs over the entire mounting surface. It is possible to suppress the resin burrs even under such a low clamp pressure as to prevent forming of dents or damage to the substrate.

Therefore, according to the present invention, it is possible to simply and stably produce a package for mounting a semiconductor element, which is free from dents or damage on a substrate and free from resin burrs over the entire mounting surface of the substrate.

DESCRIPTION OF EMBODIMENTS

In this specification, the following terms are used in the following meanings, respectively.

In a resin, "units" means structural units (monomer units) that constitute the resin.

A "fluororesin" means a resin containing fluorine atoms in its structure.

The thickness of the mold release film, the thickness of a layer (such as a first layer or a second layer) constituting a mold release film of a multi-layer structure, and the tensile storage modulus at 180° C. are, respectively, measured by the methods as described in Examples.

An arithmetic mean roughness (Ra) is an arithmetic mean roughness to be measured in accordance with JIS B0601: 2013 (ISO4287: 1997, Amd.1: 2009). The standard length lr (cut-off value λc) for roughness curve was set to be 0.8 mm.
[Process for Producing Package for Mounting Semiconductor Element]

The process for producing a package for mounting a semiconductor element of the present invention is a process for producing a package for mounting a semiconductor element by using a mold having an upper mold and a lower mold, said package for mounting a semiconductor element, comprises a substrate having a mounting surface for mounting a semiconductor element and a packaging body formed from a cured product of a curable resin and having a frame-shaped portion surrounding the mounting surface, and the package has a concave portion formed by the mounting surface and the packaging body, and said process for producing a package for mounting a semiconductor element comprises:

a step of disposing a mold release film having a substantially constant thickness over the film, on the upper mold having a convex portion of which the shape corresponds to the concave portion, disposing the substrate on the lower mold, and closing the upper mold and the lower mold so as to be in close contact with the convex portion to the mounting portion of the substrate via the mold release film, a step of filling a space formed between the upper mold and the lower mold, with a curable resin, followed by curing the curable resin, and a step of releasing a cured product of the curable resin together with the substrate, from the mold.
(Package for Mounting Semiconductor Element)

A package for mounting a semiconductor element to be produced by the process for producing a package for mounting a semiconductor element of the present invention is not particularly limited so long as it has the above substrate and the above packaging body, and it may suitably be selected from known packages for mounting a semiconductor element.

Figure 1:
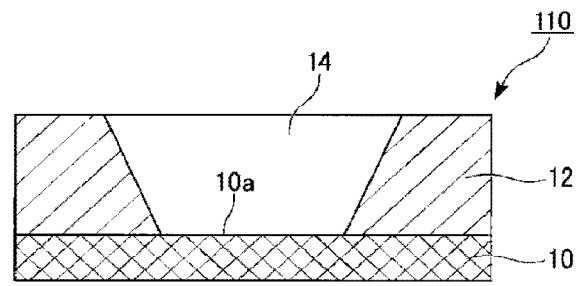
FIG. 1 is a schematic cross-sectional view illustrating an example of a package for mounting a semiconductor element, obtainable by the process for producing a package for mounting a semiconductor element of the present invention.
Figure 2:
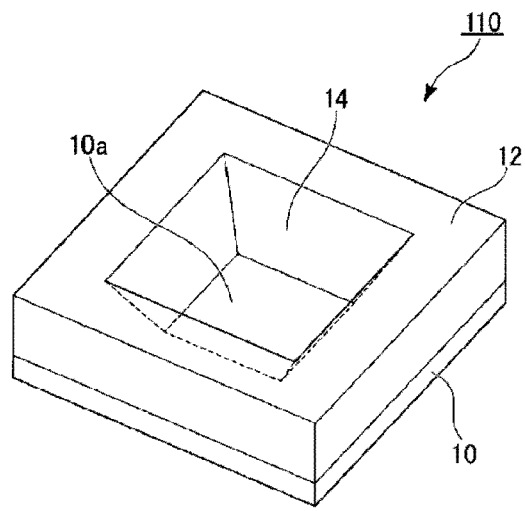
FIG. 2 is a perspective view illustrating a package for mounting a semiconductor element shown in FIG. 1.

FIG. 1 is a schematic cross-sectional view illustrating an example of a package for mounting a semiconductor element, obtainable by the process for producing a package for mounting a semiconductor element of the present invention. FIG. 2 is a perspective view illustrating the package for mounting a semiconductor element shown in FIG. 1.

The package 110 for mounting a semiconductor element has the substrate 10 and the packaging body 12 formed from a curable resin. The substrate 10 is a printed circuit board, and has a mounting surface 10a to be mounted with a semiconductor element. The substrate 10 is provided with an inner lead (not shown) on the mounting surface 10a and an outer lead (not shown) on the surface opposite to the mounting surface 10a side, and the inner lead and the outer lead are electrically connected. The packaging body 12 is a frame-shaped portion surrounding the mounting surface 10a.

In the package 110 for mounting a semiconductor element, the concave portion 14 for mounting a semiconductor element is formed by the substrate 10 and the packaging body 12. A semiconductor element is disposed on the bottom surface (mounting surface 10a) of the concave portion 14 in the package 110 for mounting a semiconductor element, the semiconductor element and the inner lead are electrically connected, and an opening of the concave portion 14 is sealed with a lid, whereby it is possible to obtain a semiconductor device having the semiconductor element mounted on a hollow portion of the package having the hollow portion.

Figure 3:
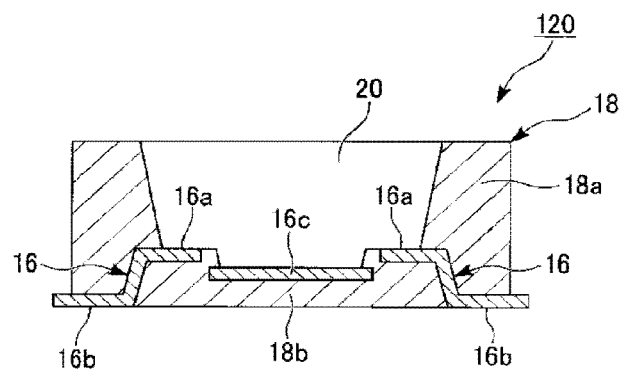
FIG. 3 is a schematic cross-sectional view illustrating another example of a package for mounting a semiconductor element obtainable by the process for producing a package for mounting a semiconductor element of the present invention.

FIG. 3 is a schematic cross-sectional view illustrating another example of a package for mounting a semiconductor element produced by the process for producing a package for mounting a semiconductor element of the present invention.

The package 120 for mounting a semiconductor element has the substrate 16 and the packaging body 18 formed from a curable resin. The substrate 16 is a lead frame having the inner lead 16a, the outer lead 16b and the die pad 16c, and the inner lead 16a and the outer lead 16b are electrically connected.

The packaging body 18 has a frame-shaped portion 18a surrounding the mounting surface (the upper surface of the inner lead 16a and the upper surface of the die pad 16c) of the substrate 16 and the bottom portion 18b.

In the package 120 for mounting a semiconductor element, a concave portion 20 for mounting a semiconductor element is formed by the inner lead 16a and the die pad 16c of the substrate 16 and the bottom portion 18b and the frame-shaped portion 18a of the packaging body 18.

A semiconductor element is disposed on the bottom surface (the upper surface of the die pad 16c) of the concave portion 20 in the package 120 for mounting a semiconductor element, the semiconductor element and the inner lead 16a are electrically connected, and an opening of the concave portion 20 is sealed with a lid, whereby it is possible to obtain a semiconductor device having a semiconductor element mounted on a hollow portion of the package having the hollow portion.

As the semiconductor element to be mounted in the package for mounting a semiconductor element, various sensors may, for example, be mentioned.

First Embodiment

As one embodiment of the process for producing a package for mounting a semiconductor element of the present invention, a case where the package 110 for mounting a semiconductor, as shown in FIG. 1, is produced by a transfer molding, will be described in detail. The process for producing a package for mounting a semiconductor element according to the embodiment of the present invention, comprises the following steps ($\alpha$1) to ($\alpha$6).

($\alpha$1) a step of disposing a mold release film having a substantially constant thickness over the film, on an upper mold of a mold having the upper mold and the lower mold, wherein the upper mold has a cavity having a plurality of convex portions on the cavity surface, and the lower mold has a substrate placement portion for placing a substrate, so that the cavity of the upper mold is covered by the mold release film, ($\alpha$2) a step of vacuum-suctioning the mold release film to the side of the cavity surface of the upper mold, ($\alpha$3) a step of disposing a substrate having a plurality of mounting surfaces, on a substrate placement portion of the lower mold so that the side opposite to the plurality of mounting surfaces faces the lower mold side, closing the upper mold and the lower mold so as to be in close contact with the plurality of convex portions of the upper mold respectively to the plurality of the mounting surfaces of the substrate via the mold release film, ($\alpha$4) a step of filling a space formed between the upper mold and the lower mold with a curable resin, followed by curing, thereby to obtain a structure having the substrate and a cured product of the curable resin, ($\alpha$5) a step of taking out the structure from the mold, and ($\alpha$6) a step of cutting the substrate and the cured product of the structure so that the plurality of the mounting surfaces are separated, thereby to obtain the package 110 for mounting a semiconductor element.

Figure 4:
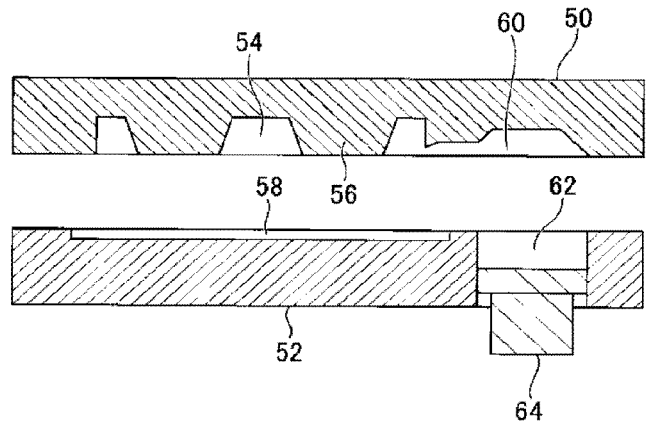
FIG. 4 is a cross-sectional view illustrating one example of a mold used in the first embodiment of the process for producing a package for mounting a semiconductor element of the present invention.

Mold:

The mold in the first embodiment may, for example, be a mold having the upper mold 50 and the lower mold 52, as shown in FIG. 4. On the upper mold 50, the cavity 54, and the concave-shaped resin introducing portion 60 for introducing the curable resin 40 to the cavity 54, are formed. The cavity 54 has a shape corresponding to the shape of the cured product to be formed on the substrate in the step ($\alpha$4), and a plurality of the convex portions 56 having a shape which is a reverse shape of the concave portion 14 in the package 110 for mounting a semiconductor element, are formed on the cavity surface of the upper mold 50.

On the lower mold 52, the substrate placement portion 58 for placing a substrate and the resin placement portion 62 for placing a curable resin are formed. Further, the plunger 64 for extruding a curable resin to the resin introducing portion 60 of the upper mold 50 is disposed in the resin placement portion 62.

Figure 5:
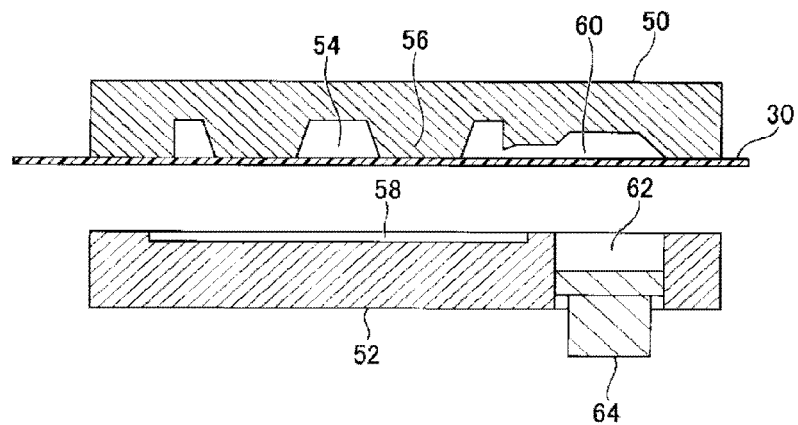
FIG. 5 is a schematic cross-sectional view illustrating a step (α1)) in the first embodiment of the process for producing a package for mounting a semiconductor element of the present invention.

Step ($\alpha$1):

As shown in FIG. 5, the mold release film 30 is disposed to cover the cavity 54 of the upper mold 50. The mold release film 30 is preferably disposed so as to entirely cover the cavity 54 and the resin introducing portion 60. The mold release film 30 is pulled by the unwind roll (not shown) and a wind-up roll (not shown), whereby it is disposed to cover the cavity 54 of the upper mold 50 in a stretched state.

As the mold release film 30, a film having a substantially constant thickness over the film is used. The substantially constant thickness over the film means that a difference between the maximum value and the minimum value of the thickness in a 1 m measurement in a machine direction and a transverse direction of a film, measured in accordance with ISO4591: 1992 (method A of JIS K7130: 1999, determination of thickness by mechanical scanning), is at most 15% to the respective average values. The mold release film 30 will be described in detail below.

Figure 6:
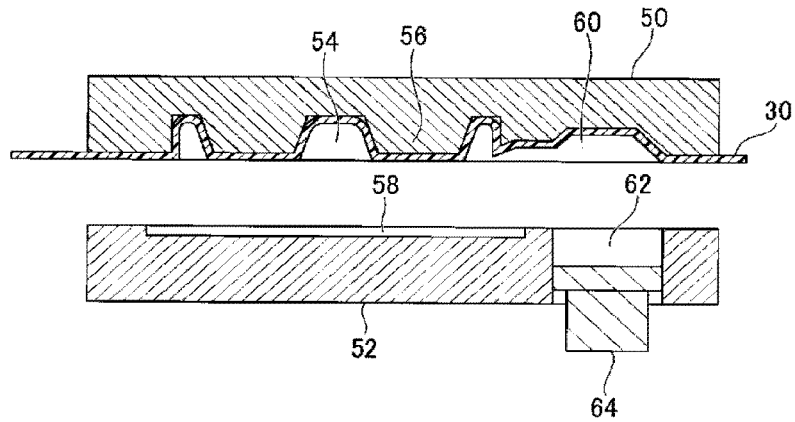
FIG. 6 is a schematic cross-sectional view illustrating a step (α2) in the first embodiment of the process for producing a package for mounting a semiconductor element of the present invention.

Step ($\alpha$2):

As shown in FIG. 6, by vacuum suctioning through a groove (not shown) formed outside of the cavity 54 of the upper mold 50, the space between the upper mold 50 and the mold release film 30 (i.e. a space between the mold release film 30, and the cavity surface and the inner wall of the resin introducing portion 60 of the upper mold 50) was depressurized, so that the mold release film 30 is stretched, deformed and vacuum-adsorbed to the cavity surface of the upper mold 50.

Here, the mold release film 30 may not always be in close contact with the cavity surface, depending upon the mechanical strength and thickness of the mold release film 30 in a high temperature environment and the shape of the cavity 54. As shown in FIG. 6, at the stage of the vacuum suctioning in step ($\alpha$2), a void space may be slightly left between the mold release film 30 and the cavity surface.

Figure 7:
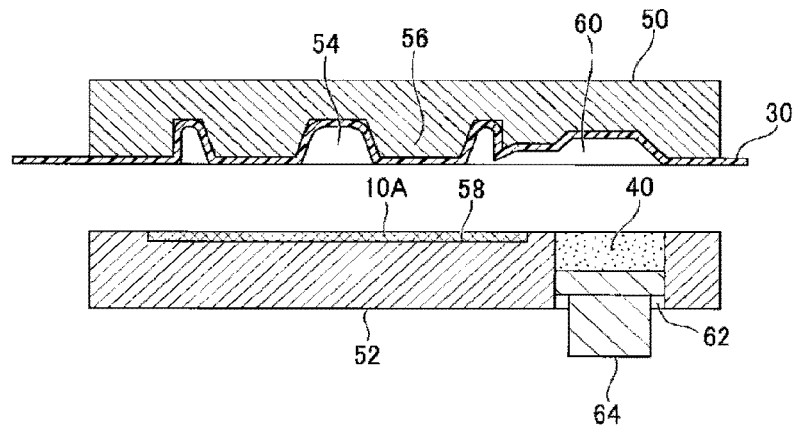
FIG. 7 is a schematic cross-sectional view illustrating a step (α3) in the first embodiment of the process for producing a package for mounting a semiconductor element of the present invention.

Step ($\alpha$3):

As shown in FIG. 7, the substrate 10A having a plurality of mounting surface (not shown) is placed on the substrate placement portion 58, and the upper mold 50 and the lower mold 52 are clamped so that the plurality of the convex portions 56 of the upper mold 50 would be respectively in close contact with the plurality of the mounting surfaces of the substrate 10A, via the mold release film. Further, on the plunger 64 of the resin placement portion 62, the curable resin 40 is disposed in advance.

The clamp pressure at the time of clamping the upper mold 50 and the lower mold 52 is such a pressure that the mold release film 30 sandwiched between the convex portion 56 and the substrate 10A would not be clashed excessively so as not to protrude to the cavity 54 side, whereby it is possible to prevent the releasing failure of the cured product due to intrusion of a portion being protruded to the cavity 54 side of the mold release film 30, into a cured product of the curable resin 40. Further, it is also possible to prevent dents or damage of the mounting surface of the substrate 10A.

In particular, the clamp pressure is preferably from 10 to 80 tons, particularly preferably from 20 to 70 tons. The pressure per unit area is preferably from 25 to 200 MPa, particularly preferably from 50 to 175 MPa.

The mold release film 30 to be used in the present invention, which has a substantially constant thickness over the film, is less likely to be protruded as mentioned above, even when the clap pressure is increased, as compared with a case where a mold release film having a convex integrally formed, as shown in the above-mentioned Patent Document 2. By increasing the clamp pressure within a range not to form dents or damage on the substrate 10A, an effect of preventing resin burrs becomes excellent.

As the curable resin 40, various curable resins to be used in the production of semiconductor packages, etc. may be used. A thermosetting resin such as an epoxy resin or a silicone resin is preferred, and an epoxy resin is particularly preferred. As an epoxy resin, for example, SUMIKON EME G770H type F ver. GR manufactured by Sumitomo Bakelite Co., Ltd., and T693/R4719-SP10 manufactured by Nagase ChemteX Corporation, may be mentioned. As commercial products of a silicone resin, LPS-3412AJ and LPS-3412B manufactured by Shin-Etsu Chemical Co., Ltd., may, for example, be mentioned.

The curable resin 40 may contain carbon black, fused silica, crystalline silica, alumina, silicon nitride, aluminum nitride, etc.

Figure 8:
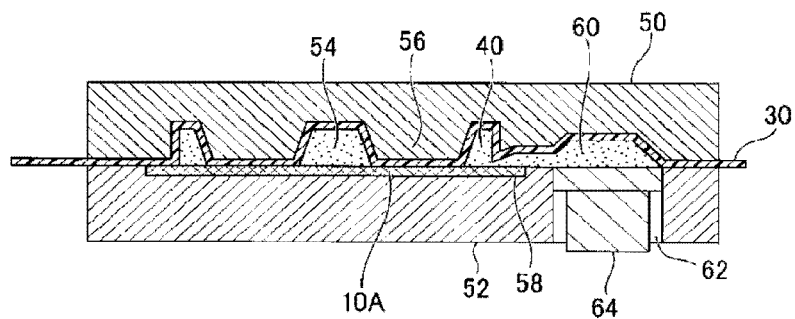
FIG. 8 is a schematic cross-sectional view illustrating a step (α4) in the first embodiment of the process for producing a package for mounting a semiconductor element of the present invention.

Step ($\alpha$4):

As shown in FIG. 8, the plunger 64 of the lower mold 52 is pushed up to fill the curable resin 40 into the cavity 54 through the resin introducing portion 60. Then, the mold is heated to cure the curable resin 40.

In the step ($\alpha$4), as the curable resin 40 is filled into the cavity 54, the mold release film 30 is further pushed to the cavity surface side of the upper mold 50 by the resin pressure and stretched and deformed so that it will be in close contact with the cavity surface. Therefore, a cured product formed will have a shape corresponding to the shape of the cavity 54.

The heating temperature of the mold at the time of curing the curable resin 40, i.e. the heating temperature of the curable resin 40 is preferably from 100 to 185° C., particularly preferably from 140 to 175° C. When the heating temperature is at least the lower limit value in the above range, the productivity of the package 110 for mounting a semiconductor element is improved. When the heating temperature is at most the upper limit value in the above range, deterioration of the curable resin 40 is prevented. From the viewpoint of suppressing a change in the shape of the cured product due to thermal expansion of the curable resin 40, when the protection of the package 110 for mounting a semiconductor element is particularly required, the heating is preferably conducted at the lowest possible temperature within the above range.

The resin pressure at the time of filling the curable resin 40 is preferably from 2 to 30 MPa, particularly preferably from 3 to 10 MPa. When the resin pressure is at least the lower limit value in the above range, a drawback such as deficiency in filling the curable resin 40 is unlikely to occur. When the resin pressure is at most the upper limit value in the above range, it is easy to obtain a package 110 for mounting a semiconductor element of excellent quality. The resin pressure of the curable resin 40, can be adjusted by the plunger 64.

Figure 9:
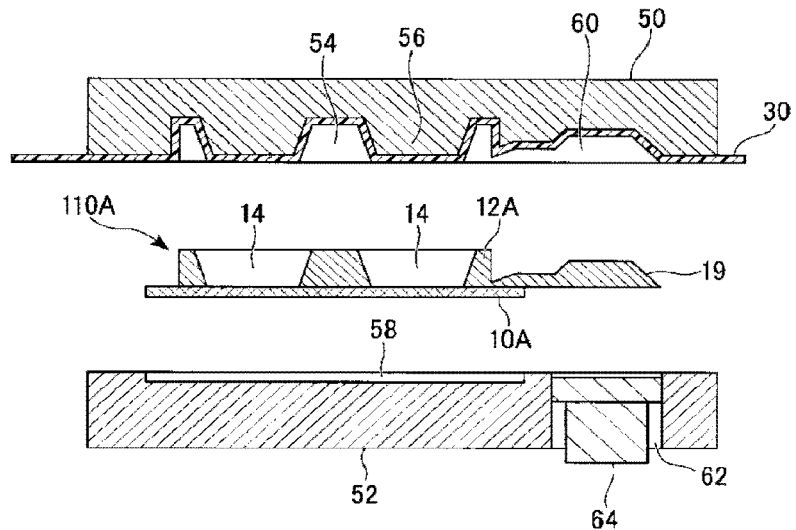
FIG. 9 is a schematic cross-sectional view illustrating a step (α5) in the first embodiment of the process for producing a package for mounting a semiconductor element of the present invention.

Step ($\alpha$5):

As shown in FIG. 9, the structure 110A formed in the step ($\alpha$4) is taken out from the mold.

The structure 110A has the substrate 10A and the cured product 12A of the curable resin 40 cured in the cavity 54. When the structure 110A is taken out from the mold, the cured product 19 of the curable resin 40 cured in the resin introducing portion 60 is adhered to the cured product 12A of the structure 110A. This cured product 19 is cut away after the structure 110A is taken out from the mold.

At the time of filling the curable resin 40 in the step ($\alpha$4), the mounting surface of the substrate 10A is in close contact with the mold release film 30, and therefore the curable resin 40 is not in contact therewith. Accordingly, the cured product 12A is formed so as to surround the plurality of mounting surfaces of the substrate 10A respectively, and the plurality of mounting surfaces of the substrate 10A are exposed respectively. Accordingly, in the structure 110A, a plurality of concave portions 14 are formed by the substrate 10A and the cured product 12A surrounding the plurality of mounting surfaces respectively.

Step ($\alpha$6):

The substrate 10A and the cured product 12A of the structure 110A obtained in the step ($\alpha$5) are cut (singulated) so that the plurality of the concave portions 14 of the structure 110A are individually separated, whereby it is possible to obtain the package 110 for mounting a semiconductor element having the substrate 10 having at least one mounting surface 10a and the frame-shaped packaging body 12 surrounding the mounting surface 10a.

Such singulation may be carried out by a known method, such as a dicing method. The dicing method is a method of cutting an object by rotating a dicing blade. As the dicing blade, typically a rotating blade (diamond cutter) having diamond powder sintered on the outer periphery of a disk, is used. Singulation by the dicing method can be carried out, for example, by a method wherein the object to be cut (structure 110A), is fixed on the processing table via a jig, and the dicing blade is permitted to run in such a state that a space to insert the dicing blade is present between the jig and the cutting area of the object to be cut.

In the step ($\alpha$6), after the step (cutting step) of cutting the object to be cut, there may be included a foreign matter-removing step of moving the processing table while supplying a liquid to the cutting object from a nozzle disposed at a position apart from the case for covering the dicing blade.

In the foregoing, the process for producing a package for mounting a semiconductor element of the present invention has been described with reference to the first embodiment, but the present invention is not limited to the above first embodiment. The respective constructions, their combinations, etc. in the above embodiment are exemplary, and additions, omissions, substitutions and other changes are possible within a range not departing from the concept of the present invention.

For example, the timing for peeling the structure 110A from the mold release film 30 is not limited to the time of taking out the structure 110A from the mold, and the structure 110A may be taken out together with the mold release film from the mold, and thereafter, the mold release film may be peeled from the structure 110A.

The mounting surface of the substrate 10 placed on the lower mold 52 may be one. In this case, the step ($\alpha$6) may not be carried out.

When the substrate 10 has a plurality of mounting surfaces, the distance between the plurality of the respective mounting surfaces may be uniform or nonuniform. Further, the respective shapes of the plurality of the mounting surfaces may be the same or different.

After the step ($\alpha$6) (or before the step ($\alpha$6) and after the step ($\alpha$5)), in order to display an optional information, a step of forming an ink layer may be conducted by applying an ink on the surface of the packaging body 12 (or cured product 12A).

The information to be displayed by the ink layer is not particularly limited, and a serial number, information about the manufacturers, a type of components, etc., may be mentioned. The ink is not particularly limited and may be suitably selected from known inks.

The method for applying the ink is not particularly limited, and for example, various printing methods may be mentioned, such as ink jet printing, screen printing, transfer from a rubber plate, etc.

As a method for forming the ink layer, in view of a high curing speed, less bleeding on the package, and little positional displacement of the package as no hot air is applied, a method of using a photocurable ink is preferred, wherein the ink is applied by an ink-jet method on the surface of the packaging body 12 and cured by irradiation with light.

As the photocurable ink, typically, a material containing a polymerizable compound (monomer, oligomer, etc.) may be used. To the ink, as the case requires, a coloring material such as a pigment or a dye, a liquid medium (solvent or dispersant), a polymerization inhibitor, a photopolymerization initiator, other various additives, etc. may be added. Other additives include a slip agent, a polymerization accelerator, a penetration enhancer, a wetting agent (humectant), a fixing agent, a fungicide, a preservative, an antioxidant, a radiation absorber, a chelating agent, a pH adjusting agent, a thickeners, etc.

As the light to cure the photocurable ink, ultraviolet ray, visible ray, infrared ray, electron beam or radiation may, for example, be mentioned.

As the light source for ultraviolet ray, a germicidal lamp, an ultraviolet fluorescent lamp, a carbon arc, a xenon lamp, a high-pressure mercury lamp for copying, a medium-pressure or high-pressure mercury lamp, a super high pressure mercury lamp, an electrodeless lamp, a metal halide lamp, an ultraviolet light emitting diode, an ultraviolet laser diode, or natural light, may, for example, be mentioned.

Light irradiation may be carried out under normal pressure or under reduced pressure. It may be carried out in air, or in an inert gas atmosphere such as a nitrogen atmosphere or carbon dioxide atmosphere.

Further, a package for mounting a semiconductor element produced by the process for producing a package for mounting a semiconductor element of the present invention is not limited to the package 110 for mounting a semiconductor element, and it may, for example, be a package 120 for mounting a semiconductor element.

The package 120 for mounting a semiconductor element can be produced in the same manner as in the first embodiment except that instead of the substrate 10, the substrate 16 is used, and the shape of the convex portion 56 is changed in accordance with the concave portion 20.

[Mold Release Film]

The mold release film 30 in the present invention may be a single-layer structure film or a multi-layer structure film.

The mold release film 30 is required to have releasability, heat resistance durable against the temperature of the mold during molding (typically from 150 to 180° C.), mechanical strength durable against the pressure or fluidity of the curable resin.

In the case of the single layer structure film, from the viewpoint of releasability, heat resistance, mechanical strength and elongation at a high temperature, the mold release film 30 is preferably a film made of at least one resin selected from the group consisting of a fluororesin and a polyolefin having a melting point of at least 200° C., particularly preferably a film made of a fluororesin. The fluororesin and the polyolefin having a melting point of at least 200° C. will be respectively described in detail below.

The multi-layer structure film may, for example, be a film having a first layer to be in contact with the curable resin at the time of curing the curable resin, and another layer. Such another layer may be one layer or at least two layers.

In view of excellent effects of preventing release failure and resin burrs, the multi-layer structure film is preferably the following mold release film (I).

Mold release film (I): A film having a first layer to be in contact with a curable resin at the time of curing the curable resin, and a second layer, the first layer has a thickness of from 3 to 25 µm and further has a tensile storage modulus at 180° C. being from 10 to 50 MPa, and the second layer has a product of the tensile storage modulus (MPa) at 180° C. and the thickness (µm) being from 2,000 to 13,000.

In a case where the process for producing a package for mounting a semiconductor element of the present invention as mentioned above is carried out by using the mold release film (I), it is preferred that the mold release film (I) is disposed on the upper mold so that the surface of the first layer side faces the substrate side (mounting surface side) in a step of letting the convex portion of the upper mold to be in close contact with the mounting surface of the substrate, via the mold release film.

In a case where the first layer to be in direct contact with the mounting surface is a soft layer having a tensile storage modulus at 180° C. being at most the prescribed level and has a thickness being at least the prescribed level, the first layer is mildly clashed even under such a low clamp pressure as to free from dents or damage of the substrate, during pressing the convex portion on the mounting surface. Further, in a case where the product of the tensile storage modulus at 180° C. and the thickness of the second layer is at most the prescribed level, the followability of the mold release film (I) to the upper mold becomes sufficient. Therefore, even when the height of the mounting surface of the substrate or the height of the convex portion is uneven, the unevenness is compensated by the first layer, and therefore the convex portion of the upper mold is sufficiently close contact with the entire molding surface of the substrate via the mold release film (I). Accordingly, the curable resin tends to hardly penetrate into a space between the convex portion and the mounting surface, whereby the resin burrs may not occur over the entire mounting surface.

Further, the second layer is preferably a layer having a product of the tensile storage modulus at 180° C. and the thickness being higher than the first layer, and is a hard layer as compared with the first layer. In a case where the first layer has a tensile storage modulus at 180° C. being at least the prescribed level and further has a thickness being at most the prescribed level, and in a case where the second layer being harder than the first layer is present on the upper mold side opposite to the first layer, it is less likely to cause such problems that, when the convex portion of the upper mold is pressed on the mounting surface of the substrate, the first layer may be excessively clashed and protruded into a cavity side, whereby the releasing failure may occur, or the mold release film (I) may break.

The tensile storage modulus at 180° C. of the first layer is particularly preferably from 10 to 40 MPa. The thickness of the first layer is more preferably from 5 to 12 µm, particularly preferably from 7 to 12 µm.

The product of the tensile storage modulus (MPa) at 180° C. and the thickness (μm) of the second layer is particularly preferably from 3,000 to 8,000.

The tensile storage modulus at 180° C. and the thickness of the second layer may respectively be optional values, and may not particularly limited so long as the product is within the above range. In particular, the tensile storage modulus at 180° C. is preferably from 90 to 600 MPa, particularly preferably from 110 to 300 MPa. The thickness is preferably from 6 to 50 μm, particularly preferably from 12 to 38 μm.

In the foregoing, with respect to the mold release film (I), it is preferred that the thickness of the first layer is from 5 to 12 μm, and the product of the tensile storage modulus (MPa) at 180° C. and the thickness (μm) of the second layer is from 3,000 to 8,000. In particular, it is particularly preferred that the thickness of the first layer is from 7 to 12 μm, and the product of the tensile storage modulus (MPa) at 180° C. and the thickness (μm) of the second layer is from 3,000 to 8,000.

The tensile storage modulus of each of the first layer and the second layer may be adjusted by the crystallinity of the resin constituting each of the first layer and the second layer (hereinafter referred to also as the resin for the first layer and the resin for the second layer, respectively). Specifically, as the crystallinity of the resin is lower, the tensile storage modulus of the layer made of the resin becomes lower. The crystallinity of the resin can be adjusted by a known method. For example, in the case of an ethylene/tetrafluoroethylene copolymer, the crystallinity can be adjusted by the ratio of the units based on tetrafluoroethylene and ethylene, the type or proportion of units based on a monomer other than tetrafluoroethylene and ethylene.

(Mold Release Film of First Embodiment)

Figure 10:
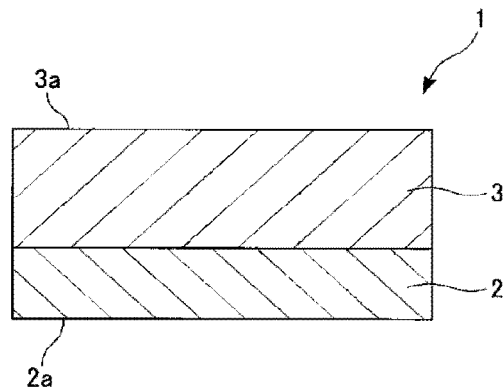
FIG. 10 is a schematic cross-sectional view illustrating the first embodiment of the mold release film of the present invention.

FIG. 10 is a schematic cross-sectional view illustrating the first embodiment of the mold release film (I).

The mold release film 1 in this embodiment is one having the first layer 2 and the second layer 3 laminated in this order. The mold release film 1 is such that the first layer 2 is in contact with a curable resin (that is, the surface 2a is in contact with a curable resin), and the second layer 3 is in contact with the upper mold of the mold (that is, the surface 3a is in contact with the upper mold of the mold) during curing of the curable resin.

<First Layer>

The first layer is a mold release layer for smoothly peeling the curable resin cured and the mold release film 1. The ranges of the tensile storage modulus at 180° C. and the thickness of the first layer 2, and preferred ranges thereof are respectively as mentioned above.

The resin constituting the first layer 2 (hereinafter also referred to as a resin for a first layer) is not limited so long as it satisfies the above-mentioned tensile storage modulus, and it may be suitably selected from known thermoplastic resins, rubbers, etc.

The first layer 2 preferably has releasability at such a level that the curable resin (packaging body) cured in such a state being in contact with the first layer 2 of the mold release film, can smoothly be peeled from the mold release film 1, at the time of producing the package for mounting a semiconductor element. Further, it preferably has a heat resistance durable against the temperature of the mold during molding (typically from 150 to 180° C.). Considering this, the resin for the first layer is preferably at least one member selected from the group consisting of a fluororesin, a polystyrene and a polyolefin having a melting point of at least 200° C. They may be used alone or two or more of them may be used in combination.

The resin for the first layer is particularly preferably a fluororesin since the releasability is excellent. When the first layer 2 is made of a fluororesin, the releasability of the cured product of the curable resin from the mold is excellent. Further, the mold release film 1 has a sufficient heat resistance durable against the temperature of the mold during molding (typically from 150 to 180° C.), strength durable against the pressure or fluidity of the curable resin, etc., and it is also excellent in elongation at a high temperature.

From the viewpoint of releasability and heat resistance, the fluororesin is preferably a fluoroolefin type polymer. The fluoroolefin type polymer is a polymer having units based on a fluoroolefin. The fluoroolefin may, for example, be tetrafluoroethylene, vinyl fluoride, vinylidene fluoride, trifluoroethylene, hexafluoropropylene, chlorotrifluoroethylene, etc. As the fluoroolefin, one type may be used alone, or two or more types may be used in combination.

The fluoroolefin type polymer may, for example, be an ethylene/tetrafluoroethylene copolymer (hereinafter referred to also as ETFE), polytetrafluoroethylene, a perfluoro(alkyl vinyl ether)/tetrafluoroethylene copolymer, etc. As the fluoroolefin type polymer, one type may be used alone, or two or more types may be used in combination.

From the viewpoint of releasability and heat resistance, a polystyrene is preferably syndiotactic polystyrene. A polystyrene may be stretched, or may contain an additive. As the polystyrene, one type may be used alone, or two or more types may be used in combination.

The melting point of the polyolefin having a melting point of at least 200° C. is preferably at least 200° C. and at most 300° C.

From the viewpoint of the releasability and mold followability, the polyolefin having a melting point of at least 200° C. is preferably polymethylpentene. As the polyolefin, one type may be used alone, or two or more types may be used in combination.

The resin for the first layer is preferably at least one member selected from the group consisting of a fluoroolefin type polymer and polymethylpentene among the above, more preferably a fluoroolefin type polymer. Among them, ETFE is particularly preferred since elongation at a high temperature is large. As ETFE, one type may be used alone, or two or more types may be used in combination.

ETFE is a copolymer comprising units based on tetrafluoroethylene (hereinafter referred to also as TFE) and units based on ethylene (hereinafter referred to also as E).

ETFE is preferably one having units based on TFE, units based on E and units based on a third monomer other than TFE and E. It is easy to adjust the crystallinity of ETFE i.e. the tensile storage modulus of the first thermoplastic resin film layer 2, by the type and content of units based on the third monomer. Further, by having units based on the third monomer (especially a monomer having fluorine atoms), the tensile strength and elongation at a high temperature (especially at about 180° C.) will be improved.

As the third monomer, a monomer having fluorine atoms or a monomer having no fluorine atom may be mentioned.

As the monomer having fluorine atoms, the following monomers (α1)) to (α5) may be mentioned.

Monomer (a1): a fluoroolefin having at most 3 carbon atoms.

Monomer (a2): a perfluoroalkyl ethylene represented by $X(CF_2)_nCY=CH_2$ (wherein X and Y are each independently a hydrogen atom or a fluorine atom, and n is an integer of from 2 to 8).

Monomer (a3): a fluorovinyl ether.

Monomer (a4): a functional group-containing fluorovinyl ether.

Monomer (a5): a fluorinated monomer having an aliphatic ring structure.

The monomer (a1)) may, for example, be a fluoroethylene (such as trifluoroethylene, vinylidene fluoride, vinyl fluoride or chlorotrifluoroethylene), or a fluoropropylene (such as hexafluoropropylene (hereinafter referred to also as HFP), or 2-hydropentafluoropropylene).

The monomer (a2) is preferably a monomer wherein n is from 2 to 6, particularly preferably a monomer wherein n is from 2 to 4. Also, a monomer wherein X is a fluorine atom, and Y is a hydrogen atom, i.e. a (perfluoroalkyl)ethylene, is particularly preferred.

As specific examples of the monomer (a2), the following compounds may be mentioned.

$CF_3CF_2CH=CH_2$, $CF_3CF_2CF_2CF_2CH=CH_2$ ((perfluorobutyl)ethylene; hereinafter referred to also as PFBE),
$CF_3CF_2CF_2CF_2CF=CH_2$,
$CF_2HCF_2CF_2CF=CH_2$,
$CF_2HCF_2CF_2CF_2CF=CH_2$, etc.

As specific examples of the monomer (a3), the following compounds may be mentioned. Here, among the following, a monomer which is a diene, is a cyclo-polymerizable monomer.

$CF_2=CFOCF_3$,
$CF_2=CFOCF_2CF_3$,
$CF_2=CF(CF_2)_2CF_3$ (perfluoro(propyl vinyl ether); hereinafter referred to also as PPVE),
$CF_2=CFOCF_2CF(CF_3)O(CF_2)_2CF_3$,
$CF_2=CFO(CF_2)_3O(CF_2)_2CF_3$,
$CF_2=CFO(CF_2CF(CF_3)O)_2(CF_2)_2CF_3$,
$CF_2=CFOCF_2CF(CF_3)O(CF_2)_2CF_3$,
$CF_2=CFOCF_2CF=CF_2$,
$CF_2=CFO(CF_2)_2CF=CF_2$, etc.

As specific examples of the monomer (a4), the following compounds may be mentioned.
$CF_2=CFO(CF_2)_3CO_2CH_3$,
$CF_2=CFOCF_2CF(CF_3)O(CF_2)_3CO_2CH_3$,
$CF_2=CFOCF_2CF(CF_3)O(CF_2)_2SO_2F$, etc.

As specific examples of the monomer (a5), perfluoro(2,2-dimethyl-1,3-dioxole), 2,2,4-trifluoro-5-trifluoromethoxy-1,3-dioxole, perfluoro(2-methylene-4-methyl-1,3-dioxolane), etc. may be mentioned.

As the monomer having no fluorine atom, the following monomers (b1) to (b4) may be mentioned.

Monomer (b1): an olefin.
Monomer (b2): a vinyl ester.
Monomer (b3): a vinyl ether.
Monomer (b4): an unsaturated acid anhydride.

As specific examples of the monomer (b1), propylene, isobutene, etc. may be mentioned.

As specific examples of the monomer (b2), vinyl acetate, etc. may be mentioned.

As specific examples of the monomer (b3), ethyl vinyl ether, butyl vinyl ether, cyclohexyl vinyl ether, hydroxybutyl vinyl ether, etc. may be mentioned.

As specific examples of the monomer (b4), maleic anhydride, itaconic anhydride, citraconic anhydride, himic anhydride (5-norbornene-2,3-dicarboxylic acid anhydride), etc. may be mentioned.

As the third monomer, one type may be used alone, or two or more types may be used in combination. The third monomer is preferably the monomer (a2), HFP, PPVE or vinyl acetate, more preferably HFP, PPVE, $CF_3CF_2CH=CH_2$ or PFBE, particularly preferably PFBE, in that adjustment of the crystallinity, i.e. the tensile storage modulus, will be thereby easy, and by having units based on a third monomer (especially a monomer having fluorine atoms), the tensile strength and elongation at a high temperature (particularly at about 180° C.) will be excellent. That is, as ETFE, particularly preferred is a copolymer having units based on TFE, units based on E and units based on PFBE.

In ETFE, the molar ratio (TFE/E) of units based on TFE to units based on E is preferably from 80/20 to 40/60, more preferably from 70/30 to 45/55, particularly preferably from 65/35 to 50/50. When TFE/E is within the above range, the heat resistance and mechanical properties of ETFE will be excellent.

The proportion of units based on the third monomer in ETFE is preferably from 0.01 to 20 mol %, more preferably from 0.10 to 15 mol %, particularly preferably from 0.20 to 10 mol %, based on the total (100 mol %) of all units constituting ETFE. When the proportion of units based on the third monomer is within the above range, the heat resistance and mechanical properties of ETFE will be excellent.

In a case where the units based on the third monomer contain units based on PFBE, the proportion of units based on PFBE is preferably from 0.5 to 4.0 mol %, more preferably from 0.7 to 3.6 mol %, particularly preferably from 1.0 to 3.6 mol %, based on the total (100 mol %) of all units constituting ETFE. When the proportion of units based on PFBE is within the above range, the tensile storage modulus at 180° C. of the mold film can be adjusted within the above range. Further, the tensile strength and elongation at a high temperature (especially at about 180° C.) will be improved.

The melt flow rate (MFR) of ETFE is preferably from 2 to 40 g/10 min, more preferably from 5 to 30 g/10 min, particularly preferably from 10 to 20 g/10 min. When MFR of ETFE is within the above range, the moldability of ETFE will be improved, and the mechanical properties of the mold release film will be excellent.

MFR of ETFE is a value as measured under a load of 49 N at 297° C. in accordance with ASTM D3159.

The first layer 2 may be one made solely of the resin for the first layer, or one having an additive such as an inorganic additive or an organic additive incorporated. As the inorganic additive, inorganic fillers such as carbon black, silica, glass fibers, carbon nanofibers, titanium oxide, etc., may be mentioned. As the organic additive, silicone oil, metal soap, etc. may be mentioned.

<Second Layer>

A range of the product of the tensile storage modulus (MPa) at 180° C. and thickness (μm) of the second layer 3, and preferred ranges of the product, the tensile storage modulus and the thickness are respectively as mentioned above.

The resin constituting the second layer 3 (hereinafter also referred to as a resin for the second layer) may be one so long as the above-mentioned product of the tensile storage modulus and the thickness are within the above ranges, and it may be suitably selected from known thermoplastic resins, rubbers, etc.

The second layer 3 preferably has releasability at such a level that the mold release film 1 can smoothly be peeled from the upper mold, at the time of the above production of a package for mounting a semiconductor element. Further, it preferably has heat resistance durable against the temperature of the mold during molding (typically from 150 to 180° C.). Considering this, the resin for the second layer is preferably at least one member selected from the group consisting of a non-stretched polyamide, a biaxially stretched polyamide, polybutylene terephthalate (hereinafter also referred to as PBT), a polyethylene terephthalate (hereinafter also referred to as PET) and a highly formable PET.

As the polyamide, nylon 6 or nylon MXD6 is preferred from the viewpoint of heat resistance, strength and gas barrier properties.

The highly formable PET is one having moldability improved by copolymerizing another monomer in addition to ethylene glycol and terephthalic acid (or dimethyl phthalate). Specifically, it is PET, of which the glass transition temperature Tg as measured by the following method, is at most 105° C.

Tg is a temperature at which tan δ (E"/E') being a ratio of the loss elastic modulus E" to the storage elastic modulus E' as measured in accordance with ISO6721-4: 1994 (JIS K7244-4: 1999) takes the maximum value. Tg is measured by raising the temperature at 2° C./min. from 20° C. to 180° C. at a frequency of 10 Hz, with a static force of 0.98 N and with a dynamic displacement of 0.035%.

As the resin for the second layer, one type may be used alone, or two or more types may be used in combination.

The resin for the second layer is particularly preferably PBT or a highly formable PBT.

The second layer 3 may be one made solely of the resin for the second layer, or one having an additive such as an inorganic additive or an organic additive incorporated. As the inorganic additive and the organic additive, the same ones as described above may be mentioned.

In the mold release film 1, the first layer 2 and the second layer 3 may be directly laminated or may be laminated via an adhesive layer not shown in the drawings.

<Surface Shape of Mold Release Film>

Of the mold release film 1, the surface to be in contact with the curable resin at the time of curing the curable resin, i.e. the surface 2a on the first layer 2 side, may be smooth or may have irregularities for increasing the releasability formed. Further, of the mold release film 1, the surface to be in contact with the upper mold of the mold at the time of curing the curable resin, i.e. the surface 3a on the second layer 3 side, may be smooth or may have irregularities for increasing the releasability formed.

The arithmetic average roughness (Ra) of the surface in the case of a smooth surface is preferably from 0.01 to 0.2 µm, particularly preferably from 0.05 to 0.1 µm. Ra of the surface in the case where irregularities are formed, is preferably from 1.5 to 2.1 µm, particularly preferably from 1.6 to 1.9 µm.

The surface shape in the case where irregularities are formed, may be a shape in which a pluralities of convexes and/or concaves are randomly distributed, or may be a shape in which a plurality of convexes and/or concaves are regularly arranged. Further, the shapes and sizes of the plurality of convexes and/or concaves may be the same or different. The convexes may be elongated ridges extending on the surface of the mold release film, or protrusions or the like scattered on the surface of the mold release film. The concaves may be elongated grooves extending on the surface of the mold release film, or holes or the like scattered on the surface of the mold release film.

The shape of ridges or grooves may be a straight line, curved line or bent line shape. On the surface of the mold release film, a plurality of ridges or grooves may be present in parallel or in stripes. Of ridges or grooves, the cross-sectional shape in a direction perpendicular to the longitudinal direction may be polygonal such as triangular (V-shape), semi-circular or the like.

The shape of the protrusions or holes may be polygonal, such as triangular pyramid, square pyramid or hexagonal pyramid, conical, hemispherical, polyhedral, other various irregular shapes or the like.

In the mold release film 1, both the surface 2a and the surface 3a may be smooth, both the surface 2a and the surface 3a may have irregularities formed thereon, or one of the surface 2a and the surface 3a is smooth, and the other has irregularities formed thereon. In a case where both the surface 2a and the surface 3a have irregularities formed thereon, Ra and/or the surface shapes of the respective surfaces may be the same or different.

With a view to preventing resin burrs, it is preferred that Ra of surface 2a on the first layer 2 side is smaller, and it is particularly preferred that the surface 2a is smooth.

From the viewpoint of excellent releasability of the mold release film 1 from the mold, it is preferred that irregularities are formed on the surface 3a of the second layer 3 side.

<Thickness of Mold Release Film>

The thickness of the mold release film 1 is preferably from 15 to 75 µm, more preferably from 17 to 62 µm, particularly preferably from 19 to 50 µm. When the thickness is at least the lower limit value in the above range, handling of the mold release film 1 will be easy, and wrinkles are less likely to occur when the mold release film 1 is disposed so as to cover the cavity of the upper mold while the mold release film 1 is pulled. When the thickness is at most the upper limit value in the above range, the mold release film 1 can easily be deformed, and the followability to the shape of the cavity of the upper mold, and therefore the mold release film 1 can be in contact with the cavity surface. Accordingly, it is possible to stably form a high quality packaging body.

It is preferred that the thickness of the mold release film 1 becomes thin within the above range as the cavity of the upper mold becomes large. Further, it is preferred that the thickness becomes small in the above range as the mold becomes more complicated mold having a plurality of cavities.

<Methods for Producing Mold Release Film 1>

The method for producing the mold release film 1 is not particularly limited, and a known method for producing a multi-layered film may be employed. As specific examples, the following methods (1) and (2) may be mentioned, and they may suitably be selected for use in consideration of e.g. the materials, thicknesses, etc. of the respective layers.

(1) A method of laminating a resin film made of the resin for the first layer and a resin film made of the resin for the second layer.

(2) A method of co-extrusion molding the resin for the first layer and the resin for the second layer.

As the method for producing the mold release film 1, the method (1) is preferred from the viewpoint of excellent production efficiency.

In the method (1), as the method for laminating the respective resin films, known various lamination methods may be employed, and for example, an extrusion lamination method, a dry lamination method, a thermal lamination method, etc. may be mentioned.

In the dry lamination method, the respective resin films are laminated by using an adhesive. As the adhesive, one known as an adhesive for dry lamination may be used. For example, it is possible to use a polyvinyl acetate type adhesive; a polyacrylic acid ester type adhesive made of a homopolymer or copolymer of an acrylic acid ester (such as ethyl acrylate, butyl acrylate, 2-ethylhexyl acrylate, etc.) or a copolymer of an acrylic acid ester with another monomer (such as methyl methacrylate, acrylonitrile, styrene, etc.); a cyanoacrylate type adhesive; an ethylene copolymer type adhesive made of e.g. a copolymer of ethylene with another monomer (such as vinyl acetate, ethyl acrylate, acrylic acid, methacrylic acid, etc.); a cellulose type adhesive; a polyester type adhesive; a polyamide type adhesive; a polyimide type adhesive; an amino resin type adhesive made of a urea resin or a melamine resin; a phenol resin type adhesive; an epoxy type adhesive; a polyurethane type adhesive obtained by cross-linking a polyol (such as polyether polyol or polyester polyol) with an isocyanate and/or isocyanurate; a reactive (meth)acrylic adhesive; a rubber type adhesive made of e.g. chloroprene rubber, nitrile rubber, styrene-butadiene rubber, etc.; a silicone type adhesive; an inorganic adhesive made of an alkali metal silicate, low melting point glass, etc.; or other adhesives.

As the resin films to be laminated by the method (1), commercial products may be used, or ones produced by known production methods may be used. The resin films may be ones subjected to surface treatment such as corona treatment, atmospheric pressure plasma treatment, vacuum plasma treatment, primer treatment, etc.

The production methods for the resin films are not particularly limited, and known production methods may be employed.

A method for producing a thermoplastic resin film having smooth surfaces on both sides, may, for example, be a melt molding method by means of an extruder equipped with a T-die having a predetermined lip width.

A method for producing a thermoplastic resin film having irregularities formed on one surface or on both surfaces, may, for example, be a method of transferring irregularities of a base die to the surface of a thermoplastic resin film by thermal processing, and from the viewpoint of productivity, the following methods (i), (ii), etc. are preferred. In the methods (i) and (ii), a roll-shaped base die is used, whereby continuous processing becomes possible, and the productivity of a thermoplastic resin film having irregularities formed, will be remarkably improved.

(i) A method wherein a thermoplastic resin film is passed between a base die roll and an impression cylinder roll, so that irregularities formed on the surface of the base die roll are continuously transferred to a surface of the thermoplastic resin film.

(ii) A method wherein a thermoplastic resin extruded from an extruder die is passed between a base die roll and an impression cylinder roll, so that at the same time as molding the thermoplastic resin into a film shape, irregularities formed on the surface of the base die roll are continuously transferred to a surface of the film-shaped thermoplastic resin.

In the methods (i) and (ii), if as the impression cylinder roll, one having irregularities formed on its surface is used, it is possible to obtain a thermoplastic resin film having irregularities formed on both surfaces.

(Mold Release Film in Second Embodiment)

Figure 11:
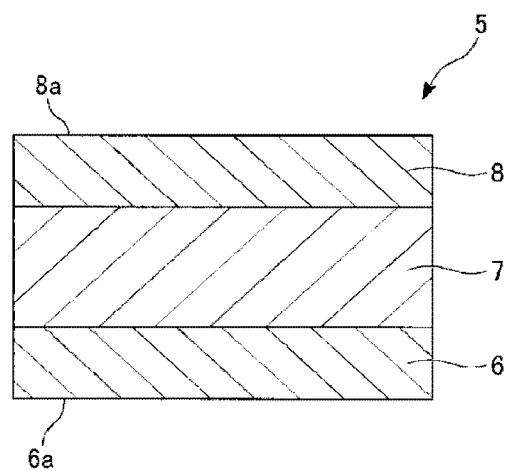
FIG. 11 is a schematic cross-sectional view illustrating the second embodiment of the mold release film of the present invention.
Figure 12:
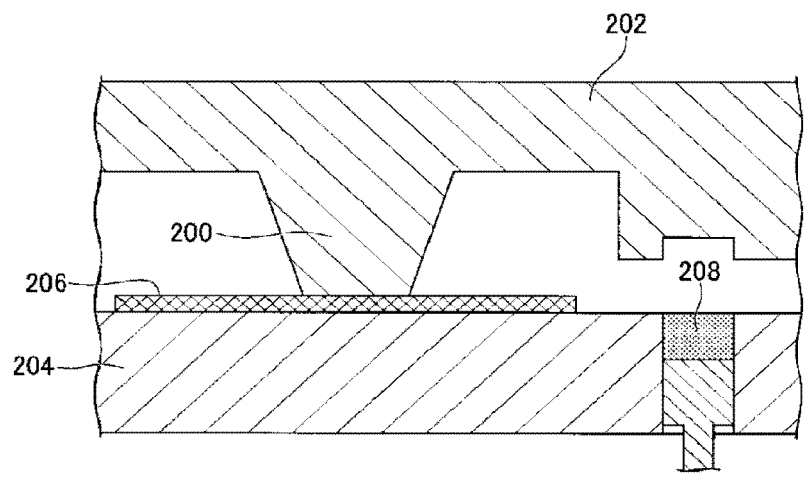
FIG. 12 is a schematic cross-sectional view for explaining an example of a conventional process for producing a hollow package.
Figure 13:
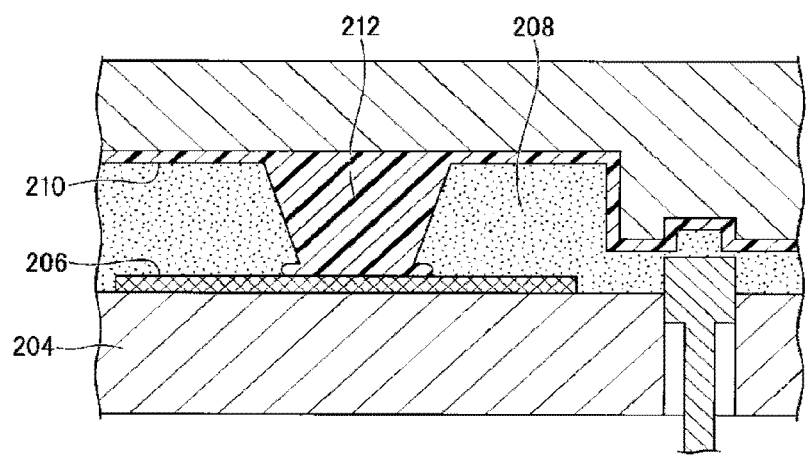
FIG. 13 is a schematic cross-sectional view for explaining another example of a conventional process for producing a hollow package and problems.
Figure 14:
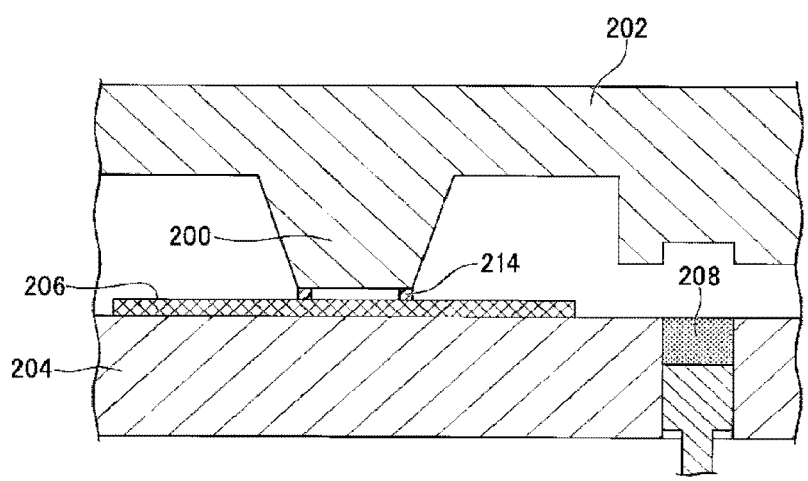
FIG. 14 is a schematic cross-sectional view for explaining yet another example of a conventional process for producing a hollow package.

FIG. 11 is a schematic cross-sectional view illustrating the second embodiment of the mold release film (I).

The mold release film 5 in this embodiment is one having the first layer 6, the second layer 7 and the third layer 8 laminated in this order. The mold release film 5 is such that the first layer 6 is in contact with the curable resin, and the third layer 8 is in contact with the upper mold of the mold, during curing the curable resin.

The first layer 6 is the same as the first layer 2 in the first embodiment.

The second layer 7 is the same as the second layer 3 in the first embodiment.

<Third Layer>

The third layer 8 is a layer for preventing the mold release film 5 from curling.

If e.g. materials of the first layer and the second layer are different in two layer structure (second layer/first layer) as shown in the first embodiment, the mold release film may curl depending upon e.g. the thickness of the second layer or the tensile storage modulus. If the mold release film curls, the mold release film may not be adsorbed to the mold due to the curling, at the time of adsorbing the mold release film to the mold. Particularly in a case where a short mold release film cut out so as to correspond to the size of a mold in advance is supplied to the mold, the problem of curling is remarkable. If a second layer having such a high tensile storage modulus or large thickness as to prevent it from curling is used, the mold followability is deteriorated, and therefore it is not suitable for a mold release film requiring mold followability.

When the third layer is disposed on the opposite side to the first layer, of the second layer, it is possible to suppress curling even when no second layer having such a high tensile storage modulus or large thickness as to prevent it from curling is used.

The tensile storage modulus at 25° C. of the third layer 8 may be the same or different from the first layer 6, but the ratio (the tensile storage modulus at 25° C. of the third layer 8/the tensile storage modulus at 25° C. of the first layer 6) is preferably from 0.5 to 2.

When the ratio of the tensile storage modulus at 25° C. is within the above range, suppression of curling becomes excellent.

The thickness of the third layer 8 may be the same or different from the thickness of the first layer 6, but the difference is preferably at most 5 μm. When the thickness of the third layer 8 is within the above range, suppression of curling becomes excellent. The thickness of the third layer 8 may, for example, be preferably from 3 to 25 μm, more preferably from 5 to 12 μm, particularly preferably from 7 to 12 μm.

The resin constituting the third layer 8 (hereinafter also referred to as a resin for the third layer) is preferably at least one member selected from the group consisting of a fluororesin, an acrylic rubber, a thermosetting silicone, a polyester, a polyamide, a polystyrene, an ethylene/vinyl alcohol copolymer and a polyolefin having a melting point of at least 200° C., in view of releasability of the mold release film 1 from the mold, the heat resistance durable against the temperature of the mold during molding (typically from 150 to 180° C.).

The fluororesin, polystyrene and polyolefin having a melting point of at least 200° C. may respectively be the same as the above.

The polyester is preferably PET, a highly formable PET, PBT or polynaphthalene terephthalate in view of heat resistance or strength.

The polyamide is preferably nylon 6 or nylon MXD6 from the viewpoint of heat resistance, strength and gas barrier properties.

They may be used alone or two or more of them may be used in combination.

The resin for the third layer is preferably at least one member selected from the group consisting of a fluororesin and a polyolefin having a melting point of at least 200° C.

The third layer 8 may be one made solely of the resin for the third layer, or one having an additive such as an inorganic additive or an organic additive. As the inorganic additive and the organic additive, the same ones as described above may be mentioned.

In the mold release film 5, the first layer 6 and the second layer 7 may be directly laminated or may be laminated via an adhesive layer not shown in the drawings. Likewise, the second layer 7 and the third layer 8 may be directly laminated or may be laminated via an adhesive layer not shown in the drawings.

<Surface Shape of Mold Release Film>

Of the mold release film 5, the surface to be in contact with the curable resin at the time of curing the curable resin, i.e. the surface 6a on the first layer 6 side, may be smooth or may have irregularities formed for increasing the releasability. Further, of the mold release film 5, the surface to be in contact with the upper mold of the mold at the time of curing the curable resin, i.e. the surface 8a on the third layer 8 side, may be smooth or may have irregularities formed for increasing the releasability. In a case where the surface is smooth, the arithmetic average roughness (Ra) of the surface is preferably from 0.01 to 0.2 μm, particularly preferably from 0.05 to 0.1 μm.

Ra of the surface in a case where irregularities are formed, is preferably from 1.5 to 2.1 μm, particularly preferably from 1.6 to 1.9 μm. The surface shape in a case where irregularities are formed, may be a shape in which a plurality of convexes and/or concaves are randomly distributed, or may be a shape in which a plurality convexes and/or concaves are regularly arranged. Further, the shape and the size of the plurality of convexes and/or concave may be the same or different. A specific example of a convex, a concave, a ridge, a protrusion or a hole may be the same as the above.

In the mold release film 5, both of the surface 6a and the surface 8a may be smooth, both of the surface 6a and the surface 8a may have irregularities formed thereon, or one of the surface 6a and the surface 8a is smooth, and the other has irregularities formed thereon. In a case where both of the surface 6a and the surface 8a have irregularities formed thereon, Ra and/or the surface shapes of the respective surfaces may be the same or different.

In view of releasability of the mold release film 5 from the mold, irregularities are preferably formed on the surface 8a of the third layer 8 side.

<Thickness of Mold Release Film>

The thickness of the mold release film 5 is preferably from 18 to 100 μm, particularly preferably from 30 to 75 μm. The reason as to why the lower limit and the upper limit of the above range of the thickness are respectively preferred is the same as in the mold release film 1.

<Process for Producing Mold Release Film 5>

The process for producing the mold release film 5 is not particularly limited, and a known process for producing a multilayer film is available. For example, it is possible to produce the mold release film 5 in the same manner as in the mold release film 1 except that the two-layer structure is changed to the three-layer structure.

In the foregoing, the mold release film (I) has been described with reference to the first embodiment and the second embodiment, but the present invention is not limited to the above embodiments. The respective constructions, their combinations, etc. in the above embodiments are exemplary, and additions, omissions, substitutions and other changes are possible within a range not to departing from the concept of the present invention.

For example, the mold release film 1 in the first embodiment may further have another layer other than an adhesive layer which may be provided as the case requires, between the first layer 2 and the second layer 3. Likewise, the mold release film 5 in the second embodiment may further have another layer other than the adhesive layer which may be provided as the case require, between the first layer 6 and the second layer 7, or between the second layer 7 and the third layer 8. As such another layer, a gas barrier layer may, for example, be mentioned. The gas barrier layer may, for example, be a metal layer, a metal vapor deposition layer or a metal oxide vapor deposition layer.

From the viewpoint of the effects of the present invention, it is preferred that the mold release film of the present invention has no layers other than the adhesive layer, between the first layer to be in contact with the curable resin and the second layer. That is, it is preferred that the first layer and the second layer are laminated directly or via an adhesive layer.

EXAMPLES

Hereinafter, the present invention will be described in detail with reference to Examples. However, the present invention is not limited by the following description. Among the following Ex. 1 to 18, Ex. 1 to 16 are Examples of the present invention, and Ex. 17 to 18 are Comparative Examples. The materials and evaluation methods used in Examples are shown below.

[Materials Used]

ETFE (1): Copolymer of tetrafluoroethylene/ethylene/PFBE=52.5/46.3/1.2 (molar ratio), produced in Production Example 1 (MFR is 12 g/10 min).

ETFE (2): A copolymer of tetrafluoroethylene/ethylene/PFBE=56.3/40.2/3.5 (molar ratio), produced in Production Example 2 (MFR is 12.5 g/10 min).

Production Example 1

Production of ETFE (1)

A polymerization tank having an internal capacity of 1.3 L and equipped with a stirrer, was deaerated; 881.9 g of 1-hydrotridecafluoro-hexane, 335.5 g of 1,3-dichloro-1,1,2,2,3-pentafluoropropane (trade name "AK225cb" manufactured by Asahi Glass Company, Limited, hereinafter referred to as AK225cb) and 7.0 g of $CH_2\!=\!CHCF_2CF_2CF_3$ (PFBE), were charged; 165.2 g of TFE and 9.8 g of ethylene (hereinafter referred to as E) were injected; the temperature in the polymerization tank was raised to 66° C.; and as a polymerization initiator solution, 7.7 mL of an AK225cb solution containing 1 mass % of tert-butyl peroxypivalate (hereinafter referred to as PBPV) was charged to initiate the polymerization.

A monomer mixture gas of TFE/E=54/46 by molar ratio was continuously charged so that the pressure would be constant during the polymerization. Further, along with the charging of the monomer mixture gas, PFBE was continuously charged in an amount corresponding 1.4 mol % to the total number of moles of TFE and E. After 2.9 hours from the initiation of the polymerization, at the time when 100 g of the monomer mixture gas was charged, the inside temperature of the polymerization tank was lowered to room temperature, and at the same time, the pressure of the polymerization tank was purged to normal pressure.

Thereafter, the slurry was suction filtered through a glass filter, and a solid content was recovered and dried at 150° C. for 15 hours to obtain 105 g of ETFE (1).

Production Example 2

Production of ETFE (2)

90 g of ETFE (2) was obtained in the same manner as in Production Example 1 except that the internal capacity of the polymerization tank was 1.2 L, the amount of 1-hydrotridecafluorohexane, the amount of AK225cb, the amount of PFBE, the amount of TFE, the amount of E and the amount of an AK225cb solution containing 1 mass % of PBPV, which were charged before initiating the polymerization, were respectively changed from 881.9 g to 0 g, 335.5 g to 291.6 g, 7.0 g to 16.0 g, 165.2 g to 186.6 g, 9.8 g to 6.4 g, and 5.8 mL to 5.3 mL in this order, and the molar ratio of TFE/E of the monomer mixture gas and the amount of PFBE, which were continuously charged during polymerization, were respectively changed from 54/46 to 58/42 and from 0.8 mol % to 3.6 mol % (to the total number of moles of TFE and E) in this order, and after 3 hours from the initiation of the polymerization, at the time when 90 g of the monomer mixture gas was charged, the inside temperature of the polymerization tank was lowered to room temperature.

<Thermoplastic Resin Film>

ETFE film (1-1): Thickness is 16 μm, one side has irregularities, Ra of the one side is 0.5, and Ra of the opposite side is 0.1. The ETFE film (1-1) was produced by the following procedure.

ETFE (1) was melt-extruded at 320° C. by an extruder having a lip opening degree adjusted so as to have a film thickness being 16 μm. The base die roll, the film-forming speed and the nip pressure was adjusted to produce an ETFE film.

ETFE film (1-2): Thickness was 12 μm. Both surfaces were smooth, and Ra of each surface was 0.1. ETFE film (1-2) was produced in the same manner as in the ETFE film (1-1) except that the respective conditions were adjusted.

ETFE film (1-3): Thickness was 25 μm. Both surfaces were smooth, and Ra of each surface was 0.1. ETFE film (1-3) was produced in the same manner as in the ETFE film (1-1) except that the respective conditions were adjusted.

ETFE film (1-4): Thickness was 50 μm. Both surfaces were smooth, and Ra of each surface was 0.1. ETFE film (1-4) was produced in the same manner as in the ETFE film (1-1) except that the respective conditions were adjusted.

ETFE film (1-5): Thickness was 3 μm. Both surfaces were smooth, and Ra of each surface was 0.1. The ETFE film (1-5) was produced in the same manner as in ETFE film (1-1) except that the respective conditions were adjusted, and further the molten ETFE (1) extruded from a T die was in contact with a PET film on a base die roller and rolled up together with the PET film so as to carry out film forming.

ETFE film (2-1): Thickness was 12 μm. Both surfaces were smooth, and Ra of each surface was 0.1. The ETFE film (2-1) was produced in the same manner as in ETFE film (1-1) except that ETFE (2) was used instead of the ETFE (1), and the respective conditions were adjusted.

PET film (1): Thickness was 12 μm. "Teijin Tetoron NS" (manufactured by Teijin DuPont Films Japan Limited) having a thickness of 12 μm was used. Glass transition temperature: 118° C. Both surfaces were smooth, and Ra of each surface was 0.2.

PET film (2): Thickness was 16 μm. "DIAFOIL HS00" (manufactured by Mitsubishi Plastics, Inc.) having a thickness of 16 μm was used. Glass transition temperature: 118° C. Both surfaces were smooth, and Ra of each surface was 0.2.

PET film (3): Thickness was 25 μm. "DIAFOIL H500" (manufactured by Mitsubishi Plastics, Inc.) having a thickness of 25 μm was used. Glass transition temperature: 118° C. Both surfaces were smooth, and Ra of each surface was 0.2.

Highly formable PET film: Thickness was 25 μm. "TEFLEX FT3PE" manufactured by Teijin DuPont Films Japan Limited was used. Glass transition temperature: 86° C. Both surfaces were smooth, and Ra of each surface was 0.2.

Non-stretched nylon film: Thickness was 20 μm. "DIAMIRON C-Z" (manufactured by Mitsubishi Plastics, Inc.) was used. Both surfaces were smooth, and Ra of each surface was 0.1.

Biaxially-stretched nylon film: Thickness was 12 μm. "HARDEN N1100" (manufactured by Toyobo Co., Ltd.) was used. Both surfaces were smooth, and Ra of each surface was 0.2.

PTFE film: Thickness was 50 μm. "NITOFLON PTFE 900UL" (manufactured by Nitto Denko Corporation) was used. Both surfaces were smooth, and Ra of each surface was 0.2.

Polymethylpentene film: Thickness was 12 μm. Both surfaces were smooth, and Ra of each surface was 0.1. The polymethylpentene film was produced by the following procedure.

A polymethylpentene resin "TPX MX004" (manufactured by Mitsui Chemicals, Inc.) was melt-extruded at 280° C. by an extruder provided with a T die having a lip opening degree adjusted so as to have a thickness of 12 μm. By adjusting the base die roll, the film-forming speed and the nip pressure, a polymethylpentene film was obtained.

PBT film (1): Thickness was 38 μm. Ra of one surface was 1.2, and Ra of the other surface was 0.1. "NOVA-DURAN 5020" (manufactured by Mitsubishi Engineering-Plastics Corporation) was melt-extruded at 280° C. by an extruder provided with a T die having a lip opening degree adjusted so as to have a thickness of 38 μm, and by adjusting the base die roll, the film-forming speed and the nip pressure, the PBT film (1) was produced.

PBT film (2): Thickness was 38 μm. Ra of one surface was 1.2, and Ra of the other surface was 0.1. "NOVA-DURAN 5505S" (manufactured by Mitsubishi Engineering-Plastics Corporation) was melt-extruded at 280° C. by an extruder provided with a T die having a lip opening degree adjusted so as to have a thickness of 38 μm, and by adjusting the base die roll, the film-forming speed and the nip pressure, the PBT film (2) was produced.

Of each film, a surface with Ra being small was used as a bonding surface in dry lamination. Further, in a case where the wet tension of the bonding surface in dry lamination of each film, based on ISO8296: 1987 (JIS K6768: 1999) was lower than 40 mN/m, the surface was subjected to corona treatment to bring the wet tension to be at least 40 mN/m.

<Adhesive Layer>

As an adhesive to be used in a dry lamination step for bonding respective films, the following urethane type adhesive A was used.

[Urethane Type Adhesive A]

Main agent: CRISVON NT-258 (manufactured by DIC Corporation)

Curing agent: Coronate 2096 (manufactured by Nippon Polyurethane Industry Co., Ltd.

The main agent and the curing agent were mixed so that the mass ratio in solid content (main agent:curing agent) would be 10:1, and ethyl acetate was used as a diluent.

[Evaluation Methods]

<Thickness>

By means of a contact type thickness meter DG-525H (manufactured by Ono Sokki Co., Ltd.) using probe AA-026 (φ10 mm SR7), the thickness of a film was measured at 10 points so that the distance in the traverse direction would be equal, and the average value was taken as the thickness.

<Tensile Storage Modulus at 180° C.>

By means of a dynamic viscoelasticity measuring apparatus SOLID L-1 (manufactured by Toyo Seiki Co., Ltd.), the storage elastic modulus E' was measured based on ISO6721-4: 1944 (JIS K7244-4: 1999). The size of the sample measured was 8 mm in width×20 mm in length, and E' measured at 180° C. by raising the temperature at 2° C./min. from 20° C. to 180° C. at a frequency of 10 Hz, with a static force of 0.98 N and with a dynamic displacement of 0.035%, was taken as the tensile storage modulus at 180° C.

<Damage or Dent in Lead Frame>

The lead frame of the package produced in each Example was visually confirmed whether dents or damage was observed at a portion which was contacted with a protrusion, whereby evaluation was carried out by the following standards.

○ (good): No damage or dent was observed.

x (bad): Damage or dents were observed.

<Resin Burrs>

Of the lead frame of the package produced in each Example, a portion (contacted portion) which was in contact with a protrusion was observed by a digital optical microscope, the contacted portion was subjected to photographing, and the resulting photographed image was mesh-divided, and the occurrence (%) of resin burrs was determined from the number of meshes where resin burrs were observed. The results were evaluated by the following standards.

○ (good): At most 10%

Δ (not bad): At most 30% and more than 10% x (bad): More than 30%

<Intrusion of Mold Release Film>

The packaging body of the package produced in each Example was visually confirmed whether the trace of the intrusion of the mold release film was observed, and evaluation was carried out by the following standards.

○ (good): No intrusion of mold release film was observed.

Δ (not bad): Intrusion of the mold release film was somewhat observed, and a dent was observed in the interface between the lead frame and the packaging body.

x (bad): The mold release film was completely intruded into the packaging body, and not released.

Ex. 1

Production of Mold Release Film

On the surface where Ra of the PBT film (1) was 0.1, the urethane type adhesive A was applied in an amount of 0.5 g/m² by gravure coating, and a corona treated surface of the ETFE film (1-2) was bonded by dry lamination to obtain a mold release film. The dry lamination conditions were set to be a substrate width of 1,000 mm, a transporting speed of 20 m/min, a drying temperature of from 80 to 100° C., a laminate roll temperature of 25° C., and a roll pressure of 3.5 MPa.

(Production of Package by Transfer Molding)

An upper mold having 500 convex portions with a round shape of Φ5 mm, and a lower mold provided with a lead frame were heated to 180° C., a mold release film was set on the upper mold, and then air between the upper mold and the mold release film was suction-discharged by a vacuum pump so that the mold release film was adsorbed to the upper mold. Thereafter, the lower mold was moved and clamped until the convex portion of the upper mold was in contact with the portion to be exposed of the lead frame via the mold release film, followed by letting a resin flow. A space between the upper mold and the lower mold was thus filled with the resin which is then cured to form a packaging body, whereby a package made of the lead frame and the packaging body was obtained. This package had 500 concave portions having a round shape of Φ5 mm, and a part of the lead frame was exposed on the bottom surface of the concave portions. Further, the injection pressure of the resin was the minimum injection pressure for transferring the shape of the hollow package in each mold release film, and the clamp pressure was the minimum pressure for reducing the resin burrs. As the resin, SUMIKON EME G770H type F ver. GR (manufactured by Sumitomo Bakelite Co., Ltd.) was used.

Ex. 2 to 6 and 8

A mold release film was obtained in the same manner as in Example 1 except that a material was selected so as to be a film construction shown in Table 1.

A package was produced in the same manner as in Example 1 by using the mold release film obtained.

Ex. 7

On the surface where Ra of the PBT film (1) was 0.1, the urethane type adhesive A was applied in an amount of 0.5 g/m² by gravure coating, and a corona treated surface of the ETFE film (1-5) was laminated on the PET film (1-1) and bonded thereto, and then the PET film (1-1) was peeled to obtain the mold release film.

A package was produced in the same manner as in Example 1 by using the mold release film obtained.

Ex. 9

On one side of the PET film (1), the urethane type adhesive A was applied in an amount of 0.5 g/m² by gravure coating, and a corona treated surface of the ETFE film (1-2) was bonded thereto. Further, on the opposite surface of the PET film (1-1), the ETFE film (1-2) was bonded in the same manner to obtain a mold release film.

A package was produced in the same manner as in Example 1 by using the mold release film obtained.

Ex. 10 to 14

A mold release film was obtained in the same manner as in Example 9 except that the material was selected so as to be the film construction shown in Table 2.

A package was produced in the same manner as in Example 1 by using the mold release film obtained.

Ex. 15

The ETFE film (1-4) was used as a mold release film.
A package was produced in the same manner as in Example 1 by using the mold release film.

Ex. 16

The ETFE film (1) was used as a mold release film.
A package was produced in the same manner as in Example 1 by using the mold release film.

Ex. 17

A package was produced in the same manner as in Example 1, without using a mold release film.

Ex. 18

A flat-shape PTFE film having a thickness equal to the height of the lower surface portion of the package is processed by e.g. etching so as to leave the convex portion to the position corresponding to the lower surface portion of the package, whereby a mold release film (convex portion-formed mold release film) is obtained.

By using an upper mold having no convex portion, a package is produced in the same manner as in Example 1 where a convex portion of the mold release film obtained is in contact with a lead frame.

The film construction of the mold release film, the product of the thickness (μm) and the tensile storage modulus at 180° C. of the second layer (MPa) (180° C. tensile storage modulus×thickness), tensile storage modulus at 180° C. of the first layer and the third layer, and the evaluation results (damage/dent of lead frame, resin burrs, intrusion of mold release film) in Ex. 1 to 16 and 18, are shown in Tables 1 to 3.

TABLE 1

| Film construction | | | Ex. 1 | Ex. 2 | Ex. 3 | Ex. 4 | Ex. 5 | Ex. 6 | Ex. 7 | Ex. 8 |
|---|---|---|---|---|---|---|---|---|---|---|
| | Second layer | | PBT film (1) | Highly formable PET film | PBT film (1) | PBT film (1) | PBT film (2) | PBT film (1) | PBT film (1) | PBT film (1) |
| | Adhesive layer | Composition for forming adhesive layer | Urethane type adhesive A | Urethane type adhesive A | Urethane type adhesive A | Urethane type adhesive A | Urethane type adhesive A | Urethane type adhesive A | Urethane type adhesive A | Urethane type adhesive A |
| | | First layer | ETFE film (1-2) | ETFE film (1-2) | ETFE film (1-1) | ETFE film (2-1) | ETFE film (1-2) | Polymethyl-pentene film | ETFE film (1-5) | ETFE film (1-3) |
| 180° C. tensile storage modulus × thickness of second layer (MPa · μm) | | | 4,560 | 3,500 | 4,560 | 4,560 | 2,660 | 4,560 | 4,560 | 4,560 |
| 180° C. tensile storage modulus of first layer (MPa) | | | 40 | 40 | 40 | 10 | 40 | 30 | 40 | 40 |
| Damage or dent of lead frame | | | ○ | ○ | ○ | ○ | ○ | ○ | ○ | ○ |
| Resin burrs | | | ○ | ○ | ○ | ○ | ○ | ○ | Δ | ○ |
| Intrusion of mold release film | | | ○ | ○ | ○ | ○ | Δ | ○ | ○ | Δ |

TABLE 2

| Film construction | | | Ex. 9 | Ex. 10 | Ex. 11 | Ex. 12 | Ex. 13 | Ex. 14 |
|---|---|---|---|---|---|---|---|---|
| | Third layer | | ETFE film (1-2) | ETFE film (1-2) | ETFE film (1-2) | ETFE film (1-2) | ETFE film (1-2) | ETFE film (1-2) |
| | Adhesive layer | Composition for forming adhesive layer | Urethane type adhesive A | Urethane type adhesive A | Urethane type adhesive A | Urethane type adhesive A | Urethane type adhesive A | Urethane type adhesive A |
| | | Second layer | PET film (1) | PET film (2) | PET film (3) | Highly formable PET film | Non-stretched nylon film | Biaxially-stretched nylon film |
| | Adhesive layer | Composition for forming adhesive layer | Urethane type adhesive A | Urethane type adhesive A | Urethane type adhesive A | Urethane type adhesive A | Urethane type adhesive A | Urethane type adhesive A |
| | | First layer | ETFE film (1-2) | ETFE film (1-2) | ETFE film (1-2) | ETFE film (1-2) | ETFE film (1-2) | ETFE film (1-2) |
| 180° C. tensile storage modulus × thickness of second layer (MPa · μm) | | | 6,000 | 8,000 | 12,500 | 2,250 | 5,600 | 7,200 |
| 180° C. tensile storage modulus of first layer (MPa) | | | 40 | 40 | 40 | 40 | 40 | 40 |

TABLE 2-continued

| | Ex. | | | | | |
|---|---|---|---|---|---|---|
| | 9 | 10 | 11 | 12 | 13 | 14 |
| 180° C. tensile storage modulus of third layer (MPa) | 40 | 40 | 40 | 40 | 40 | 40 |
| Damage or dent of lead frame | ◯ | ◯ | ◯ | ◯ | ◯ | ◯ |
| Resin burrs | ◯ | ◯ | Δ | ◯ | ◯ | ◯ |
| Intrusion of mold release film | ◯ | ◯ | ◯ | Δ | ◯ | ◯ |

TABLE 3

| Ex. | 15 | 16 | 17 | 18 |
|---|---|---|---|---|
| Film | ETFE film (1-4) | PTFE film | No mold release film | Convex portion-formed mold release film |
| Damage or dent of lead frame | ◯ | ◯ | x | ◯ |
| Resin burrs | ◯ | Δ | x | ◯ |
| Intrusion of mold release film | Δ | ◯ | ◯ | x |

As shown in the above results, in Ex. 1 to 16, no damage or dent of a lead frame was observed, and resin burrs were sufficiently prevented. Further, intrusion of the mold release film of the packaging body was prevented. On the other hand, in Ex. 17 where the convex portion of the upper mold was directly in contact with the lead frame without using a mold release film, damage or dents were observed on the lead frame of the package obtained, and many resin burrs were also observed.

In Ex. 18 where a mold release film having a convex portion integrally formed was used, the mold release film is completely intruded into a packaging body in the evaluation of intrusion of a mold release film, and therefore a package cannot be released.

Among Exs. 1 to 16, intrusion of a mold release film was somewhat observed in Exs. 5, 8, 12 and 15, but no intrusion of a mold release film was observed in Exs. 1 to 4, 6 to 7, 9 to 11, 13 to 14 and 16, in the evaluation of intrusion of a mold release film, such being preferred.

The reason why results of Exs. 1 to 4, 6 to 7, 9 to 11, 13 to 14 and 16 are superior to the results of Exs. 5 and 12, is considered to be such that the mold release film is relatively hard and is hardly clashed during clamping, since the 180° C. tensile storage modulus×thickness of the second layer is large as compared with Exs. 5 and 12.

The reason why the results of Exs. 1 to 4, 6 to 7, 9 to 11, 13 to 14 and 16 are superior to the results of the result of Ex. 8, is considered to be such that the change in thickness is relatively small when the first layer is clashed during clamping, since the thickness of the first layer is small as compared with Ex. 8.

The reason why the results of Exs. 1 to 4, 6 to 7, 9 to 11, 13 to 14 and 16 are superior to the result of Ex. 15, is considered to be such that the mold release film, which has the second layer, is hardly clashed during clamping since such a mold release film is harder than that of Ex. 15 in which the mold film has only the first layer (a single layer film of ETFE), and that the change in thickness when the mold release film is clashed is relatively small, since the thickness of the first layer is small as compared with Ex. 15.

Among Exs. 1 to 16, the occurrence of the resin burrs is at most 30% and more than 10% in Exs. 7, 11 and 16, but on the other hand, the occurrence of the resin burrs was at most 10% in Exs. 1 to 6, 8 to 10 and 12 to 15.

The reason why results of Exs. 1 to 6, 8 to 10 and 12 to 15 are superior to the result of Ex. 7, is considered to be such that the mold release film tends to be easily clashed during clamping, since the thickness of the first layer is large as compared with Ex. 7.

The reason why results of Exs. 1 to 6, 8 to 10 and 12 to 15 are superior to the result of Ex. 11, is considered to be such that the mold release film is relatively soft and tends to be easily clashed during clamping, since the second layer has a 180° C. tensile storage modulus×thickness being small as compared with Ex. 11.

The reason why results of Exs. 1 to 6, 8 to 10 and 12 to 15 are superior to the result of Ex. 16, is considered to be such that the mold release film tends to be easily clashed during clamping, and the adhesion between the mold release film and the contact portion tends to be high, since the first layer thereof being in contact with the contact portion is soft as compared with the PTFE film.

From the above results, it was possible to confirm that the above mold release film to be used for producing a package is particularly preferably a mold release film having a first layer having a tensile storage modulus at 180° C. being from 10 to 50 MPa and a thickness being from 5 to 12 μm, and a second layer having a product of the tensile storage modulus (MPa) at 180° C. and the thickness (μm) being from 3,000 to 8,000, as used in Exs. 1 to 4, 6, 9 to 10 and 13 to 14.

INDUSTRIAL APPLICABILITY

The process for producing a package for mounting a semiconductor element of the present invention is used in various fields of a process for producing a package for mounting a semiconductor element such as a solid-state imaging element or MEMS, especially as a process for producing a hollow structure package for mounting a semiconductor element.

This application is a continuation of PCT Application No. PCT/JP2015/056733, filed on Mar. 3, 2015, which is based upon and claims the benefit of priority from Japanese Patent Application No. 2014-045466 filed on Mar. 7, 2014. The contents of those applications are incorporated herein by reference in their entireties.

REFERENCE SYMBOLS

1: mold release film, 2: first layer, 2a: surface, 3: second layer, 3a: surface, 5: mold release film, 6: first layer, 6a: surface, 7: second layer, 8: third layer, 8a: surface, 10: substrate, 10a: mounting surface, 10A: substrate, 12: packaging body, 12A: cured product, 14: concave portion, 16: substrate, 16a: inner lead, 16b: outer lead, 16c: die pad, 18: packaging body, 18a: frame-shaped portion, 18b: bottom portion, 19: cured product, 20: concave portion, 30: mold release film, 40: curable resin, 50: upper mold, 52: lower mold, 54: cavity, 56: convex portion, 58: substrate placement portion, 60: resin introducing portion, 62: resin placement portion, 64: plunger, 110: package for mounting semiconductor element, 120: package for mounting semiconductor element, 200: convex portion, 202: upper mold, 204: lower mold, 206: lead frame, 208: resin, 210: mold release film, 212: convex portion, 214: bank

What is claimed is:

1. A mold release film, comprising:
    a first layer to be in contact with a curable resin at the time of curing the curable resin;
    a second layer directly laminated on the first layer or directly laminated on an adhesive layer which is directly laminated on the first layer; and
    a third layer provided on an opposite surface of the second layer with respect to the first layer, the third layer being directly laminated on the second layer or directly laminated on an adhesive layer which is directly laminated on the second layer,
    wherein the first layer has a thickness of from 3 to 25 μm and further has a tensile storage modulus at 180° C. being front 10 to 40 MPa,
    wherein the only resin(s) present in the first layer is at least one selected from the group consisting of a fluororesin and a polystyrene,
    wherein the second layer has a product of the tensile storage modulus (MPa) at 180° C. and the thickness (μm) being from 2,000 to 13.000 MPa·μm,
    wherein the third layer has a thickness of from 3 to 25 μm, and a ratio of a tensile storage modulus at 25° C. of the third layer to a tensile storage modulus at 25° C. of the first layer is from 0.5 to 2, and
    wherein a resin constituting the second layer is at least one member selected from the group consisting of a polybutylene terephthalate, a polyethylene terephthalate, and a highly formable polyethylene terephthalate.

2. The mold release film according to claim 1, wherein the first layer has a thickness of from 5 to 12 μm, and
    the second layer has a product of the tensile storage modulus (MPa) at 180° C. and the thickness (μm) being from 3,000 to 8,000 MPa·μm.

3. The mold release film according to claim 1, wherein a resin constituting the third layer is at least one member selected from the group consisting of a fluororesin, an acrylic rubber, a thermosetting silicone, a polyester, a polyamide, a polystyrene, an ethylene/vinyl alcohol copolymer, and a polyolefin having a melting point of at least 200° C.

4. The mold release film according to claim 1, wherein the fluororesin is a fluoroolefin polymer.

5. The mold release film according to claim 4, wherein the fluoroolefin polymer is at least one member selected from the group consisting of an ethylene/tetrafluoroethylene copolymer, polytetrafluoroethylene, and a perfluoro(alkyl vinyl ether)/tetrafluoroethylene copolymer.

6. The mold release film according to claim 1, wherein a resin constituting the second layer is at least one member selected from the group consisting of a polyethylene terephthalate and a highly formable polyethylene terephthalate.

7. The mold release film according to claim 1,
    wherein a surface of the first layer is smooth.

8. The mold release film according to claim 7,
    wherein an arithmetic average roughness (Ra) of the surface of the first layer is from 0.01 to 0.2 μm.

9. The mold release film according to claim 1,
    wherein irregularities are formed on a surface of the first layer.

10. The mold release film according to claim 9,
    wherein an arithmetic average roughness (Ra) of the surface of the first layer is from 1.5 to 2.1 μm.

11. The mold release film according to claim 1,
    wherein irregularities are formed on a surface of the third layer.

12. The mold release film according to claim 1,
    wherein a thickness of the mold release film is from 18 to 100 μm.

13. The mold release film according to claim 1,
    wherein a thickness of the mold release film is from 30 to 75 μm.

14. The mold release film according to claim 1, wherein the only resin(s) present in the first layer are a fluororesin and a polystyrene.

15. The mold release film according to claim 1, wherein the only resin present in the first layer is a fluororesin.

16. A process for producing a package for mounting a semiconductor element, the process comprising:
    disposing the mold release film according to claim 1 on an upper mold of a mold having a convex portion, the mold release film having a substantially constant thickness over the mole release film;
    disposing a substrate on a lower mold of the mold, the substrate having a mounting portion on which a semiconductor element is to be mounted;
    closing the upper mold and the lower mold such that the convex portion is in contact with the mounting portion of the substrate via the mold release film;
    filling a space formed between the upper mold and the lower mold with a curable resin;
    curing the curable resin to obtain a cured product, and
    releasing the cured product from the mold together with the substrate, to obtain a package which comprises the substrate and a frame-shaped portion of the cured product which surrounds the mounting portion of the substrate,
    wherein the first layer of the mold release film is in contact with the curable resin at the time of curing the curable resin.

17. The process according to claim 16, wherein the first layer has a thickness of from 5 to 12 um, and
    the second layer has a product of the tensile storage modulus (MPa) at 180° C. and the thickness (μm) being from 3,000 to 8,000 MPa·μm.

18. The process according to claim 16,
    wherein the third layer is in contact with the mold at the time of curing the curable resin.

* * * * *